(12) United States Patent
Yamashita

(10) Patent No.: US 6,459,272 B1
(45) Date of Patent: Oct. 1, 2002

(54) APPARATUS AND METHOD FOR INSPECTING WIRING ON BOARD

(75) Inventor: Munehiro Yamashita, Uji (JP)

(73) Assignee: Nidec-Read Corporation, Uji (JP)

( * ) Notice: Subject to any disclaimer, the term of this patent is extended or adjusted under 35 U.S.C. 154(b) by 0 days.

(21) Appl. No.: 09/575,550

(22) Filed: May 22, 2000

(30) Foreign Application Priority Data

May 24, 1999 (JP) ............................................. 11-142971
Dec. 7, 1999 (JP) ............................................. 11-347386

(51) Int. Cl.⁷ ............................................. G01R 31/02
(52) U.S. Cl. ...................................... 324/529; 324/754
(58) Field of Search .............................. 324/754, 529, 324/158 P, 239, 158.1, 95

(56) References Cited

U.S. PATENT DOCUMENTS

| | | | | |
|---|---|---|---|---|
| 3,992,663 A | * | 11/1976 | Seddick | 324/539 |
| 4,542,333 A | * | 9/1985 | Koontz | 324/529 |
| 5,317,255 A | * | 5/1994 | Suyama et al. | 324/158 P |
| 5,414,356 A | * | 5/1995 | Yoshimura et al. | 324/239 |
| 5,554,927 A | | 9/1996 | Maruyama | |
| 5,631,572 A | * | 5/1997 | Sheen et al. | 324/754 |
| 5,992,741 A | * | 11/1999 | Robertson et al. | 235/449 |

FOREIGN PATENT DOCUMENTS

| | | |
|---|---|---|
| JP | 559146 | 1/1980 |
| JP | 5590864 | 7/1980 |
| JP | 62257070 | 11/1987 |
| JP | 63186211 | 8/1988 |
| JP | 1242972 | 9/1989 |
| JP | 763822 | 3/1995 |
| JP | 7244083 | 9/1995 |
| JP | 9264919 | 10/1997 |
| JP | 11133088 | 5/1999 |
| JP | 11133090 | 5/1999 |
| KR | 9527402 | 10/1995 |

* cited by examiner

Primary Examiner—N. Le
Assistant Examiner—Vincent Q. Nguyen
(74) Attorney, Agent, or Firm—Price and Gess

(57) ABSTRACT

A magnetic field applying portion is positioned above a magnetic field applied region, and applies a magnetic field to the magnetic field applied region. Among probes which are abutted against ball grids of wirings, two probes are selectively connected electrically to a current detector section whereby a closed circuit is formed. This causes the closed circuit to carry an induced current as the magnetic flux through the magnetic field the magnetic field applied region changes with time. A current detector of the current detector section detects the value of the induced current, and whether there is a short-circuit is judged based on the detected current value.

30 Claims, 19 Drawing Sheets

(a)

(b)

APPARATUS AND METHOD FOR INSPECTING WIRING ON BOARD

BACKGROUND OF THE INVENTION

1. Field of the Invention

The present invention relates to an apparatus and a method for inspecting wiring on a circuit board, and more particularly it pertains to such circuit board inspection apparatus and method which inspect for any occurrence of a short-circuit and/or discontinuity of the wirings on the board. The present invention is applicable to inspection of wirings which are formed on various types of boards or substrates, such as printed circuit boards, flexible wiring films or substrates, multi-layer wiring boards, glass substrates for liquid crystal displays and plasma displays, and film carriers for semiconductor packages.

2. Description of Prior Arts

In general, a plurality of wirings are formed on a board in a wiring pattern. A number of wiring inspection apparatuses have already been proposed and marketed which are capable of inspecting whether a wiring pattern is finished as designed. In order to inspect, for example, whether mutually adjacent pair of wirings, sequentially selected from a group of wirings forming the wiring pattern, are short-circuited or not, a conventional wiring inspection apparatus presses a pair of conductive spring probes, electric terminals or the like (representatively referred to as probes) respectively against the selected wirings. A short-circuit condition between the selected pair of wirings is inspected by checking whether a predetermined current flows through the probes as a voltage is applied between the probes.

Such a short-circuit inspection is conducted usually after the wiring pattern is formed on the board by electroplating or other appropriate methods but before electronic parts are mounted on the board.

Immediately after a wiring pattern is formed, all the wiring paths of the wiring pattern are electrically connected to a temporary common wiring which is used for electroplating. Hence, it is not possible to perform a short-circuit inspection described above in this condition. To cope with this problem, a conventional method for wiring inspection employs a step of mechanically insulating the wiring from one another. In more detail, with reference to FIG. 21 a portion 11 is punched out of a board 1 together with wirings or wiring paths formed thereon to form an elongated opening and to separate the wirings 21 of a wiring pattern 2, e.g., seven wirings 21 from the common wiring or conductor 3 on the end of one side (i.e., the left-hand side in FIG. 21) of the wirings 21. Thus, the wirings 21 are electrically separated and insulated from one another. In this condition, seven conductive spring probes (FIG. 21 shows only four probes P1 through P4 for the simplicity of illustration) are pressed against ball grids or pads 22 respectively connected with the corresponding wirings 21 and disposed on the opposite surface of the board 1. Short-circuit inspection is carried out with a voltage being applied to sequentially selected pairs of the probes and electric current is detected therefrom. As to boards which are determined nondefective as a result of the short-circuit inspection, each extra portion of the board 1 is severed along a cutting line 12 (which is denoted at dashed-and-dotted line in FIG. 21), to finish the circuit board in a final shape.

The conventional short-circuit inspection of the wirings 21 as described above, requires a punching step for separating the wirings 21 from the common wiring 3 and thereby from one another. This additional step increases a cost for producing a printed wiring board. In addition, since it is necessary to ensure a additional area on the board 1 dedicated solely for the punching, an initial board size must be larger than the size of a final printed wiring board, thus even further increasing the production cost of the board. Moreover, recent design requirement for the wiring patterns of printed wiring boards, makes it impossible to leave or form a punch-through portion on the wiring boards as described above.

Thus, it would be an improvement if printed wiring boards could be inspected with the temporary common wiring 3 left unremoved. However, a wiring inspection apparatus or a wiring inspection method to enable such inspection has not been proposed to this date.

It is not only printed wiring boards which require the performance as described above, but glass substrates for liquid crystal displays and plasma displays as well may enjoy the merit of such procedure. That is, as a plurality of transparent electrodes are disposed on a glass substrate, it would be an improvement to inspect a wiring pattern of the group of transparent electrodes with the ends of the transparent electrodes electrically connected to each other.

The above operation also remains true as to film carriers for semiconductor packages. In a semiconductor package of a film carrier type, a plurality of wirings are arranged on a film carrier in conformity with the layout or arrangement of a semiconductor chip. Therefore, it would be an improvement to inspect a wiring pattern of the group of wirings with the ends of the wirings electrically connected to each other.

Further, for the purpose of improved productivity in the manufacturing of wiring boards, wirings are printed or deposited on a plurality of unit boards which are arranged contiguous in a plane one-dimensionally or two-dimensionally and integrated with each other. Where those unit boards are small or flexible, one can easily handle these boards if the boards are integrated into a somewhat large size during the formation of the wirings thereon and the inspection of their wirings. It is therefore effective to manufacture a wiring board with more than one of the unit boards integrated with one another and handled as one block.

FIGS. 22A and 22B show an example of a plurality of work pieces or unit boards WC (16 pieces in the example in FIG. 22A) which are integrated with each other in two dimensional arrangements as a work W. The work pieces will finally be separated from one another into eventually discrete unit pieces or boards, and are respectively incorporated in electric appliances or the like. Wiring processing such as plating, deposition and etching of wirings is performed on the integral work W. In this case, immediately after the wiring process, wiring patterns of the work pieces WC are connected to each other while wirings in each one of the work pieces are connected to each other. FIG. 22B shows an example of a circuit pattern formed on each of the work pieces WC.

When such a board or work W is to be inspected by the conventional method as described earlier, inspection is conducted on each of the work pieces WC after they are separated into discrete elements from one another. In the manufacturing, the work pieces are severed from each other and the wirings are separated from each other before the inspection of the wiring, and an integrated circuit chip and other circuit components are thereafter mounted on each work piece. However, the workability of the single work pieces WC is particularly poor when the work pieces WC are small or flexible. If the work pieces could be inspected while they are integrated with one another into a collective or unitary work piece, i.e., the condition just after the wirings are formed, their workability for the inspection will improve, and circuit components may be mounted respectively on the work pieces while they are integral with one another, thereby enhancing workability of the work pieces for the circuit component mounting.

SUMMARY OF THE INVENTION

Accordingly an object of the present invention is to provide a circuit board inspection apparatus which enables inspection of wirings or wiring paths on a circuit board while the wirings are electrically connected with one another on a common terminal.

Another object of the present invention is to provide a method for inspecting wirings or a conductive path on a circuit board while the wirings are electrically connected with one another.

Still another object of the present invention is to provide a circuit board inspection apparatus which enables inspection of wirings respectively formed on a plurality of circuit board units or work pieces while the units or pieces are integrated with one another with the wirings being electrically connected with one another.

Yet another object of the present invention is to provide a circuit board inspection apparatus for inspecting unexpected short-circuit and/or continuity of wirings or electric conductor patterns respectively formed on a plurality of board units or work pieces while the units and pieces are in a workable condition.

Further object of the present invention is to provide a circuit board inspection apparatus which inspects a plurality of circuit board units or work pieces efficiently.

Yet further object of the present invention is to provide a method for efficiently inspecting a plurality of circuit board units or work pieces while the units or pieces are integrated with one another with the wirings being electrically connected with one another.

Still further object of the present invention is to provide a circuit board inspection apparatus which has an effective and space saving structure for the inspection of wirings or a conductive path on a circuit board while the wirings are electrically connected with one another.

According to one aspect of the present invention, a magnetic field is supplied to the ends of the wirings that are electrically connected with each other and a magnetic flux of the magnetic field is caused to change with time, whereby an induced current flows between the wirings. The induced current is detected, and whether there is a short-circuit or disconnection in the wirings is judged based on monitoring of the detection result. Hence, it is possible to inspect the wirings with the ends of the wirings electrically connected with each other, which in turn leads to the following specific effects. That is, it is not necessary to perform a step, which is essential to inspections using the conventional wiring inspection apparatuses and conventional wiring inspection methods, of insulating between the wirings, and hence, a manufacturing cost is reduced. Further, it is possible to inspect whether there is a disconnection or short-circuit in such a board which can not be treated with this step.

According to another aspect of the present invention, when there are a plurality of same or different wiring patterns formed, whether there is a short-circuit or disconnection in wirings can be judged after positioning each wiring pattern relative to the magnetic field generation unit. Hence, it is possible to continuously inspect the respective wiring patterns one after another to find whether the wirings which form each wiring pattern are defective or not.

According to another aspect of the present invention, two wirings or wire paths are selected out of a wiring group or pattern which is formed by three or more wirings as an object wiring pair. A magnetic field is applied to the object wiring pair while a magnetic flux of the magnetic field changes with time, whereby an induced current flows through the object wiring pair. The induced current is detected, and whether there is a short-circuit or disconnection in the object wiring pair is judged. After judging, the test protocol is switched to a different object wiring pair. In a similar manner, application of a magnetic field to the new object wiring pair, current detection and judgment are performed with respect to all wiring pairs of the wiring group while sequentially switching between the wiring pairs. Hence, it is possible to inspect all wirings with the ends of the wirings of the wiring group still connected with each other.

According to still another aspect of the present invention, magnetic field applying means may comprise: (a-1) a core which is entirely formed by a conductive magnetic material and includes a first leg portion with a first end surface, a second leg portion with a second end surface and a link portion which links the leg portions to each other, the core being located on one side to the work, the first and second end surfaces of the core being faced respectively with the first ends of the wirings of different ones among work pieces; (a-2) a coil which is wound around the link portion; and (a-3) a magnetic path generation plate which is formed by a soft magnetic material, the magnetic path generation plate being disposed parallel to the work on the other side to the work so that a magnetic flux which exits at one of the end surfaces of the core is guided to the other one of the end surfaces of the core and a magnetic circuit is consequently formed. Since such magnetic field applying unit is used and since the magnetic field is applied simultaneously to the wirings, the following effect is obtained. That is, a signal is supplied to the magnetic field applying unit to thereby change the magnetic flux of the magnetic field with time, whereby an induced current flows through the wirings of the work pieces which face to the core. Based on the induced current, whether there is a short-circuit or disconnection in the wirings of the work pieces is judged, and hence, it is possible to efficiently inspect the wirings of the plurality of work pieces.

BRIEF DESCRIPTION OF THE DRAWINGS

The exact nature of this invention, as well as its objects and advantages, will become readily apparent from consideration of the following specification as illustrated in the accompanying drawings, in which like reference numerals designate like parts throughout the figures thereof, and wherein.

DESCRIPTION OF THE PREFERRED EMBODIMENTS

Figure 1:
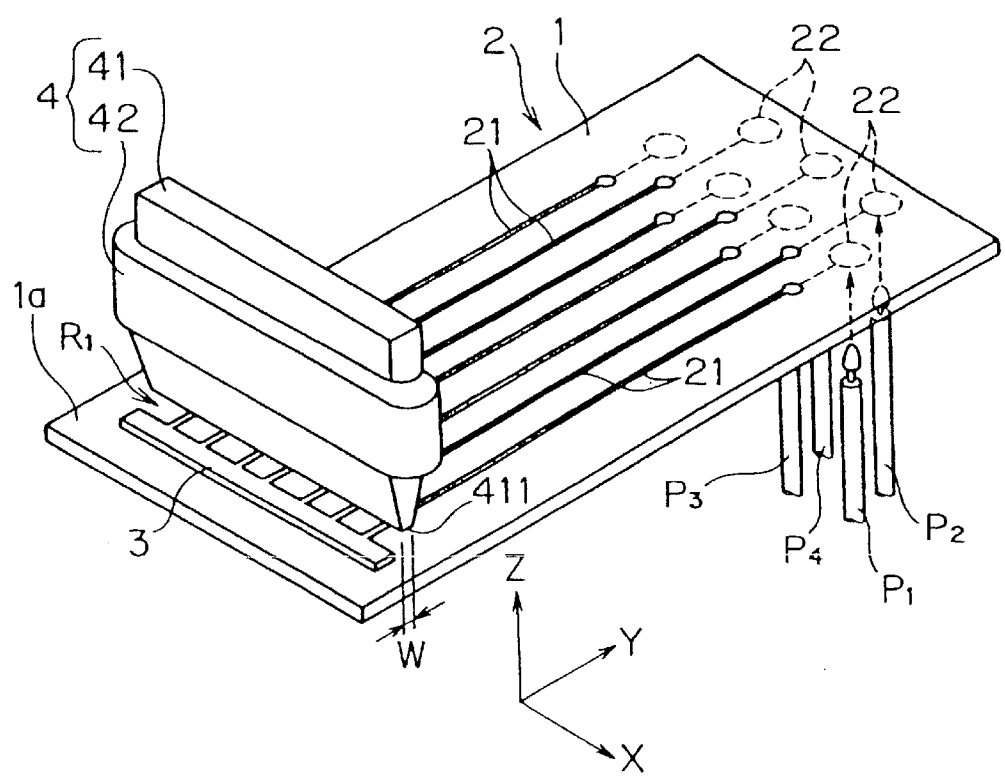
FIG. 1 is a partial perspective view showing a main portion of a first embodiment of a wiring inspection apparatus according to the present invention.
Figure 2:
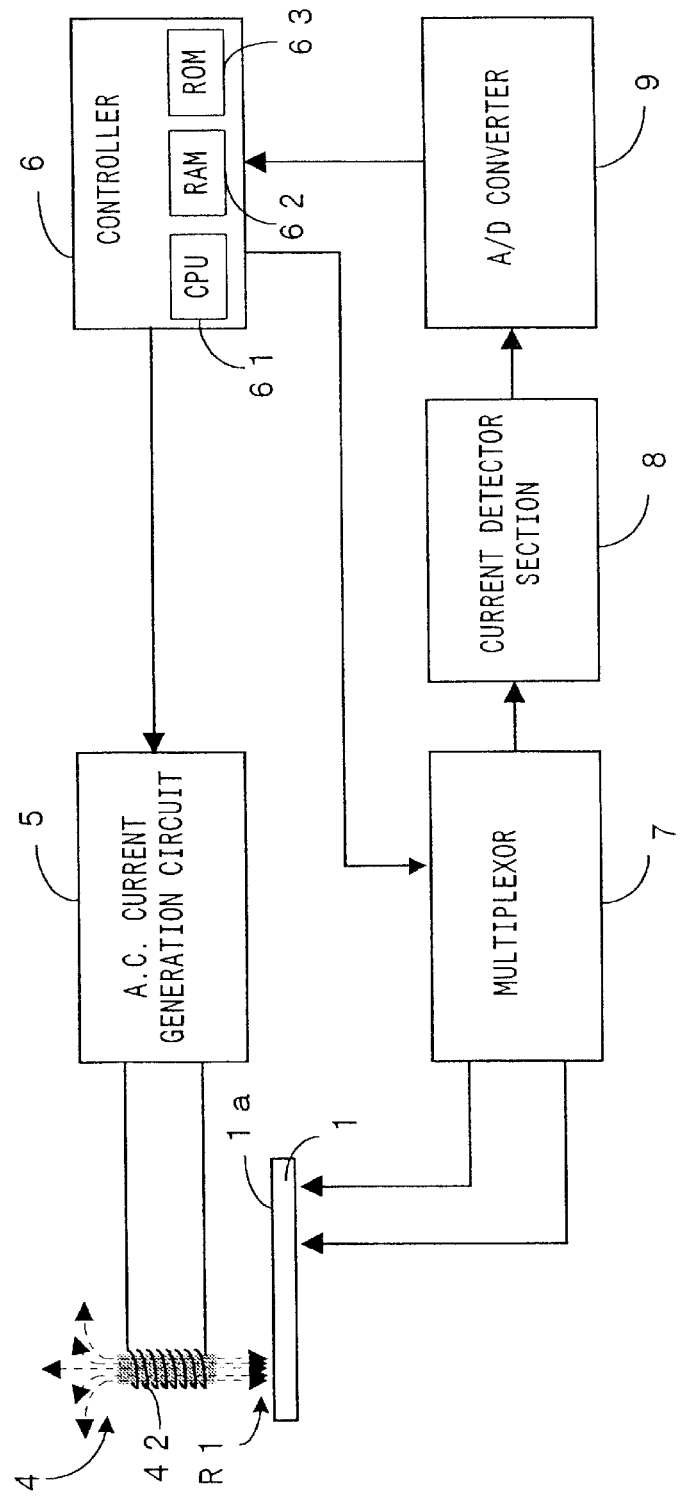
FIG. 2 is a block diagram showing an electric circuit for the wiring inspection apparatus shown in FIG. 1.

FIG. 1 is a partial perspective view showing a main portion of a first embodiment of a wiring inspection apparatus according to the present invention. FIG. 2 is a block diagram showing an electric circuit for the wiring inspection apparatus shown in FIG. 1. The wiring inspection apparatus comprises a magnetic field applying portion 4 for applying a magnetic field to one ends of wirings 21 forming a wiring pattern 2 on a circuit board 1 to be inspected. The term "one ends of the wirings 21" refers to end portions of the wirings 21 adjacent to and connected to a temporary common wiring 3 which is temporarily formed for supplying current for electroplating and is cut away from the wirings 21 finally when the circuit board 1 is in use.

In the following description, the term "board" or "circuit board" refers to these various types of wiring boards, film and substrates and will not be limited in term of its material, structure, shape, or size. The term "wiring" refers to any of electrically conductive path, track, trace, strip of layer and the like formed on the board and is not limited in term of its material, structure, shape, size or method for forming it.

The one ends of the wirings 21 is located on the left-hand side in FIG.1.

The magnetic field applying portion 4 is formed of a core 41 and a coil 42 which is wound around the core 41. The core 41 is made of a soft magnetically conductive material such as permalloy, ferrite and silicon steel so as to have a high permeability. The core 41, as shown in FIG. 1, is hexagonal in side cross section but is shaped like a column along a direction X traversing the wirings 21. The core 41 is disposed above a principal surface 1a of the board 1 such that a front end surface (first end surface i.e. bottom end in FIG.1) 411 of the core 41 adjacently confronts one ends of all of the wirings 21.

As shown in FIG. 2, the coil 42 is connected to an A.C. current generation circuit 5. The A.C. current generation circuit 5 operates in response to a control signal from a controller 6 to supply the coil 42 with an A.C. signal. The A.C. signal causes the magnetic field applying portion 4 to generate a magnetic field. The A.C. current generation circuit 5 and magnetic field applying portion 4 thus functions as magnetic field generation unit or means. The magnetic field applying portion 4 applies the magnetic field to a region R1 of the circuit board 1 which is close to an area where the wirings 21 are connected with the temporary common wiring 3 for electroplating. Hence, the magnetic flux of the magnetic field intersects the one ends of the wirings 21. For the convenience of description, the region R1 in the principal surface 1a of the board 1 to which a magnetic field is applied as described above will be hereinafter referred to as "a magnetic field applied region."

On the other ends of the wirings 21, seven conductive spring probes (FIG. 1 shows only four probes P1 through P4.) are pressed against ball grids 22, i.e. the other ends of the respective wirings 21. The other ends of the wirings 21 is located on the right-hand side and formed on the bottom surface of the circuit board 1 in FIG. 1.

Figure 3:
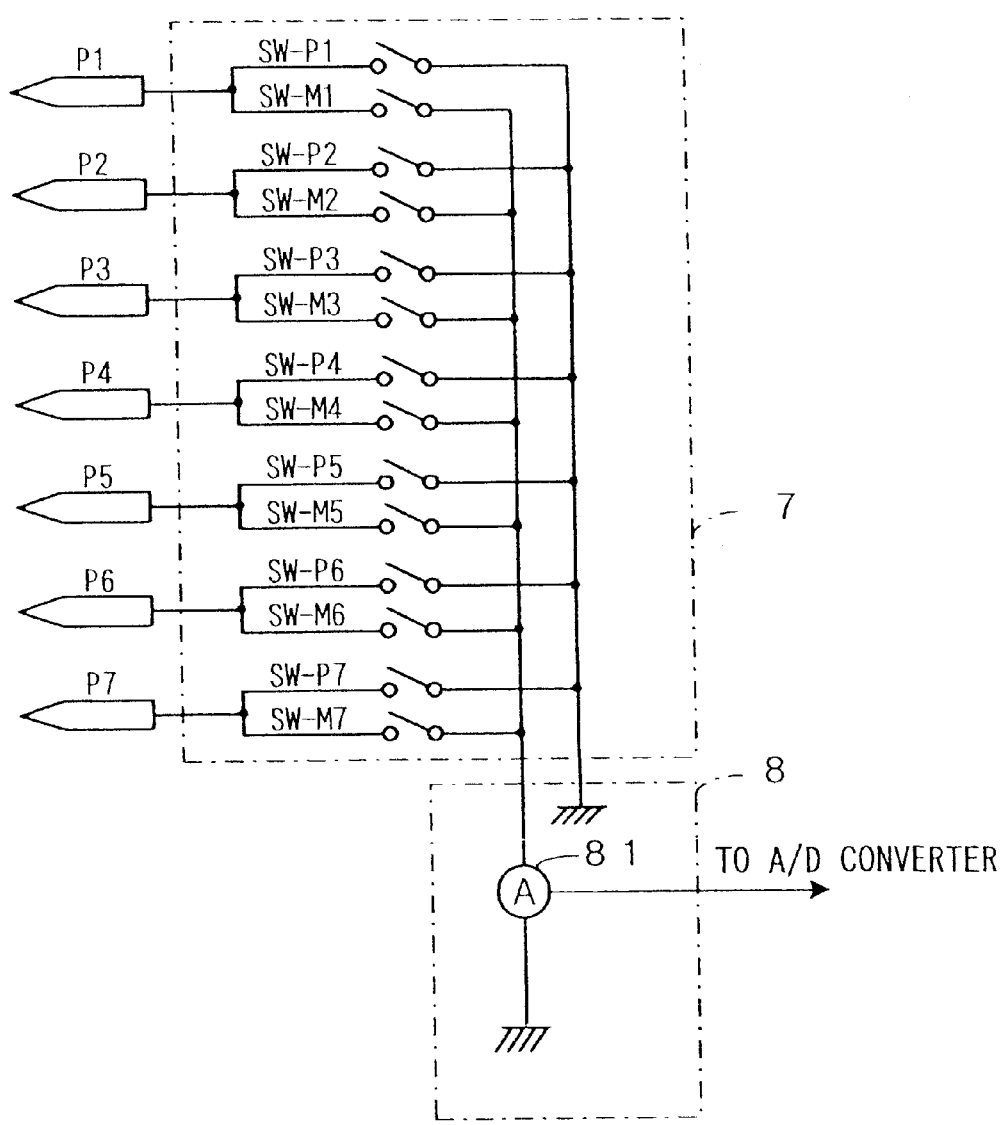
FIG. 3 is a block diagram showing a multiplexor and probes for current detection.

Those seven conductive spring probes P1 through P7, as shown in FIG. 3, form a connector unit and are connected with a current detector 8 through a multiplexor 7 which is formed by fourteen switches SW-P1 through SW-P7 and SW-M1 through SW-M7. In accordance with a selection signal given from the controller 6, the multiplexor 7 controls ON/OFF of the respective switches SW-P1 through SW-P7 and SW-M1 through SW-M7. The multiplexor 7 connects only two of the seven probes P1 through P7 with the current detector 8. More specifically, one probe member is selected with one of the P-series switches SW-P1 through SW-P7 being turned on, while another probe member is selected with one of the M-series switches SW-M1 through SW-M7 being turned on.

Figure 4:
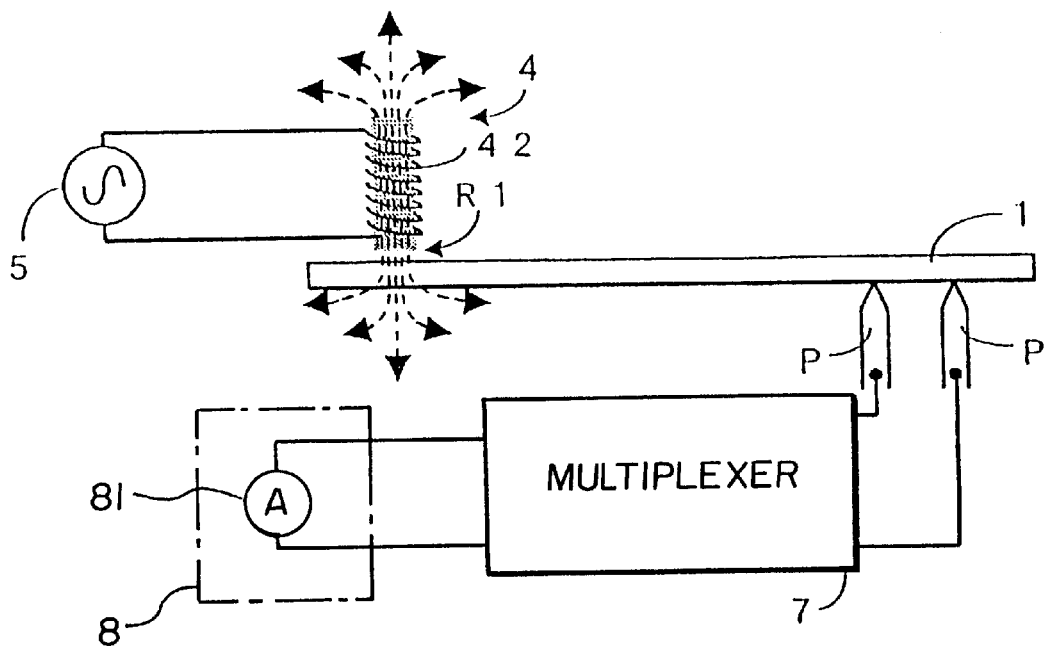
FIG. 4 is a schematic diagram for showing a basic operation of the wiring inspection apparatus shown in FIG. 1.
Figure 5:
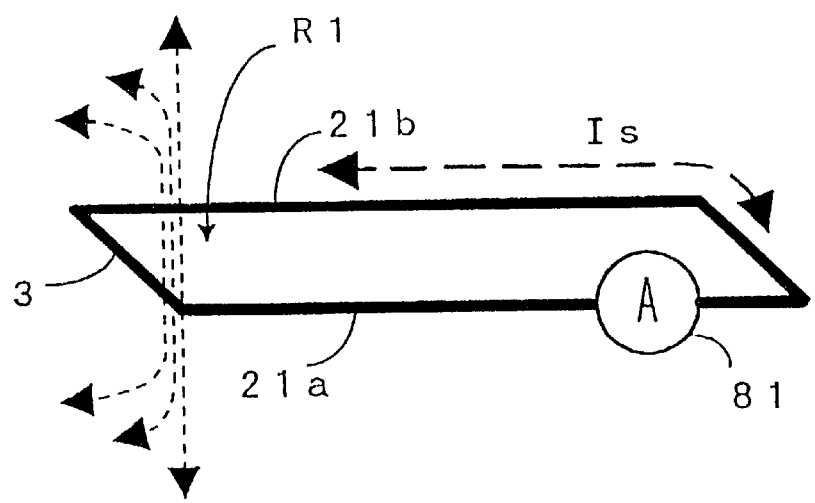
FIG. 5 is a schematic diagram showing a test current flow through a pair of wirings which are not short-circuited.
Figure 6:
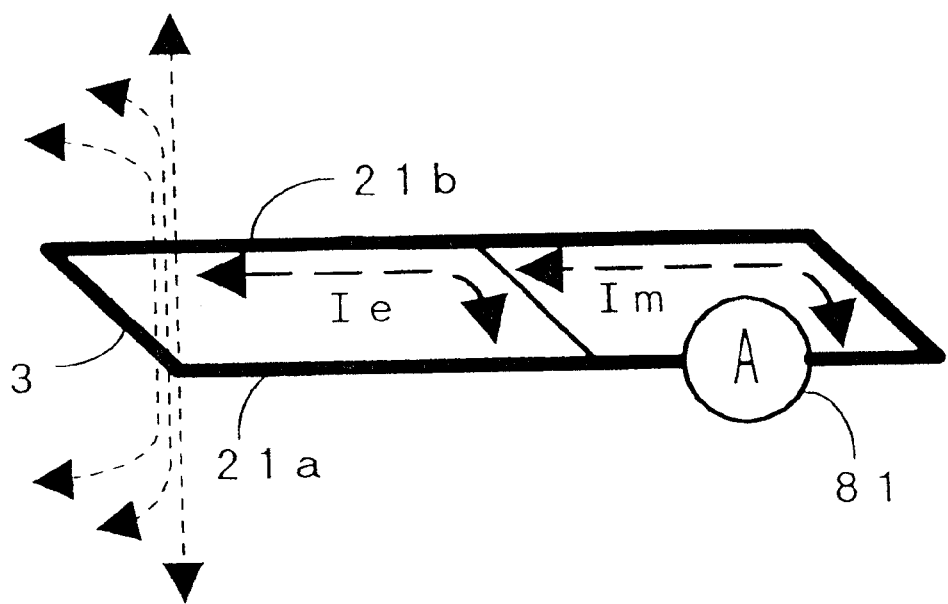
FIG. 6 is a schematic diagram showing a test current flow through a pair of wirings which are not short-circuited.

As each one of P-series and M-series switches are turned on as mentioned above, a closed circuit is formed, as shown in FIGS. 4 and 5, of the current detector 8, the multiplexor 7, the two selected probes P and P, a first and a second wirings 21a and 21b which are engaged by and electrically connected with the two probes P and P, and the wiring 3. When the A.C. current generator 5 supplies A.C. current to the coil 42, the magnetic flux of the magnetic field caused at the magnetic field applying portion 4 varies. This variation in the magnetic flux induces an electric current in the wirings at the magnetic field applied region R1. The induced current flows through the closed circuit or continuous electrical path and is detected by a current detector 81 of the current detector unit or section 8.

Where the first and the second wirings 21a and 21b are not unexpectedly short-circuited with each other, all the induced current flows into the current detector 81 as shown in FIG. 5. In contrast thereto, where the first and the second wirings 21a and 21b are short-circuited with each other as shown in FIG. 6, a portion of the induced current shunts to the short-circuited path, whereby the current flowing into the current detector 81 decreases. Hence, the output from the current detector 81 indicates whether there is a short-circuit between the first and the second wirings 21a and 21b. In the wiring inspection apparatus according to the first embodiment, as shown in FIG. 2, the output of the current detector section 8 (the current detector 81) is supplied to the controller 6 through an A/D converter 9.

The controller 6 comprises a CPU 61 for making calculation, comparison and other processing, a RAM 62 for temporarily storing data, as results of calculation and the like which are supplied from a circuit component such as the A/D converter 9, an operation panel (not shown), and a ROM 63 for storing an operation program and the like. The controller 6 controls the circuit board inspection apparatus in accordance with an operational sequence which will be described below such as to determine whether the wiring pattern 2 is defective or not.

Figure 7:
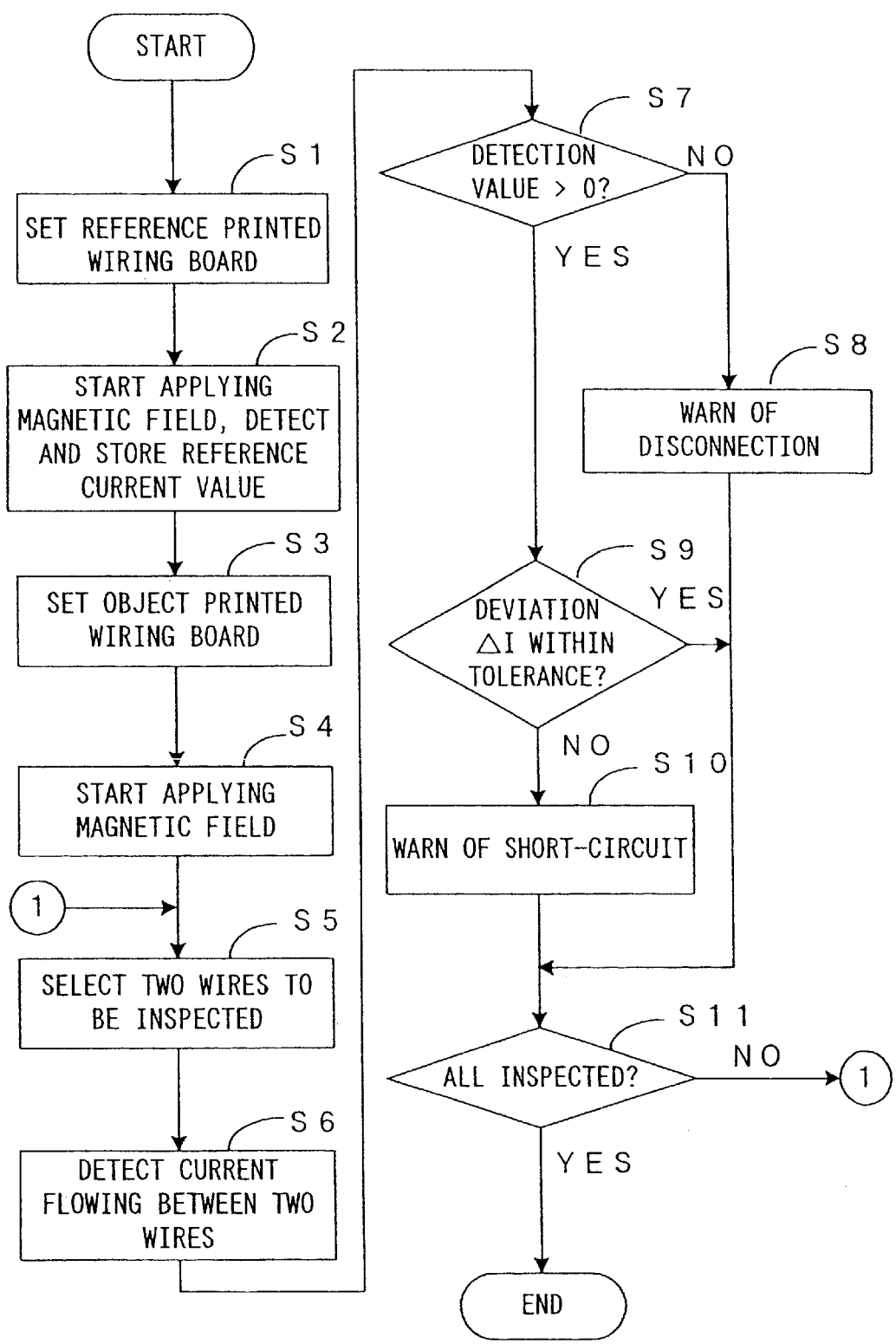
FIG. 7 is a flow chart for showing an operation of the inspection apparatus shown in FIGS. 1 and 2.

FIG. 7 is a flow chart showing an operation of the inspection apparatus shown in FIGS. 1 and 2. In the following, the inspection sequence will be described with reference to FIG. 7.

First, prior to inspection of an object printed wiring board which is to be inspected, a reference printed wiring board which has a non-defective wiring pattern is prepared and set at an inspection station on the inspection apparatus described above (step S1). Following this, a known XY positioning mechanism positions the magnetic field applying portion 4 right above the magnetic field applied region R1, and then a pressing mechanism which is known per se, presses the seven conductive spring probes against the ball grids 22 of the corresponding wirings 21.

The controller 6 thereafter sends a control signal to the A.C. current generation circuit 5 to make it supply A.C. current to the coil 42. The magnetic field applying portion 4 generates a magnetic field which is applied to the magnetic field applied region R1 while the magnetic flux passing through the region R1 changes with time. The controller 6, in the meantime, provides the multiplexor 7 with a selection signal to turn on one of the switches SW-P1 through SW-P7 and one of the switches SW-M1 through SW-M7, whereby a pair of probes are selected out of the seven probes P1 through P7. The selected pair of probes are connected with the current detector section 8. As described above, according to the first embodiment, the multiplexor 7 serves as "selection means" in the invention, and each pair of probes of the seven wirings or wire paths 21 are sequentially selected as an object wiring pair.

As a result, a closed circuit is formed by the current detector section 8, the multiplexor 7, the two selected probes P and P, the first and the second wirings 21a and 21b which are electrically connected with the two probes P and P, and the temporary common wiring 3 (FIGS. 4 and 5). Thus, the closed circuit carries an induced current whenever the magnetic flux changes with time at the magnetic field applied region R1, and the current detector 81 of the current detector section 8 detects a current value Is representing the induced current. In the first embodiment, the current value Is which is thus detected is stored in the RAM 62 as "a reference current value" (step S2).

Although the paragraph immediately above has just described that the RAM 62 stores the reference current value data, the ROM 63 may be formed by an EEPROM or the like so that the reference current value data is written in the ROM 63 and the reference current value data actually measured as described above is read when the inspection apparatus restarts. In addition, while the first embodiment requires the inspection apparatus to actually measure the reference current value, instead of actual measurement, an operator may enter a reference current value data in an operation panel (not shown) which is used for entering control data, instruction signals and the like. The entered reference current value will be written in the RAM 62, the ROM 63 or the like. These modifications are applicable to other embodiments which will be described later.

After storing of the reference current value is completed (step S2) as described above, the reference printed wiring board is removed from the inspection apparatus while the object printed wiring board to be inspected is set in the inspection apparatus (step S3). Thereafter the controller 6 supplies a press instruction to the pressing mechanism so that the seven conductive spring probes are pressed against the ball grids 22 of the corresponding wirings 21.

The controller 6 also sends a position adjusting instruction signal to the XY positioning mechanism to thereby align the magnetic field applying portion 4 right above the magnetic field applied region R1, and thereafter supplies the control signal to the A.C. current generation circuit 5. In response to the control signal, the A.C. current generation circuit 5 starts supplying an A.C. current so as to apply a magnetic field to the magnetic field applied region R1 (step S4). The controller 6 thereafter provides the multiplexor 7 with the selection signal which can select the first pair of probes P1 and P2, for instance, whereby a pair of the probes P1 and P2 out of the seven probes P1 through P7 are connected with the current detector section 8 (step S5). As a result, a closed circuit is formed by the current detector section 8, the multiplexor 7, the two selected probes P1 and P2, the first and the second wirings 21a and 21b which are connected with the two probes P1 and P2, and the temporary common wiring 3.

The time changing magnetic flux induces a current in the closed circuit. If there is no disconnection in the first and the second wirings 21a and 21b, the current detector 81 of the current detector section 8 detects a current of the value which represents the induced current (step S6). In contrast thereto, if there is a disconnection in at least one of the first and the second wirings 21a and 21b, the value of the current detected by the current detector 81 is zero, since the closed circuit is not formed.

It then follows that from the detection of whether the current detected by the current detector 81 is zero or not, it is determined at step S7 whether there is a disconnection in the first and the second wirings 21a and 21b. That is, when it is determined, at the step S7, "NO" which means the detected current value is zero, at least one of the first and the second wirings 21a and 21b has a disconnection, and therefore, a display panel (not shown) shows warning of disconnection or a warning message is provided at a step S8.

Conversely, when it is determined, at the step S7, "YES" which means there is no disconnection in the first and the second wirings 21a and 21b, the sequence proceeds to a step S9 to judge whether there is a short-circuit between the first and the second wirings 21a and 21b. In more detail, at the step S9, non-existence of a short-circuit is determined based on whether the difference ΔI between the detected and the reference current values are within a predetermined tolerance. The reason is that whereas all the induced current due to the changing magnetic flux, flows into the current detector 81 and therefore the detected current is almost the same as the reference current value as shown in FIG. 5 when there is not a short-circuit. When the wirings 21a and 21b are short-circuited with each other between the magnetic field applied region R1 and the ball grids 22, a portion of the induced current shunts into the short-circuit and therefore current flowing into the current detector 81 is much smaller than the current induced at the magnetic field applied region as shown in FIG. 6. This first embodiment utilizes this principle.

When it is judged at the step S9 that the difference ΔI is outside of the tolerance range, that is, when it is determined that the wirings 21a and 21b are short-circuited, the sequence proceeds to a step S11 after the display panel makes a disconnection warning or a warning message is provided (step S10). On the contrary, when it is judged that the difference ΔI is within the tolerance range, that is, when it is determined that the wirings 21a and 21b are not short-circuited, the sequence proceeds immediately to the step S11.

At step S11, it is judged whether the inspection of disconnection and the short-circuit as described above have been performed on all the pairs of adjacent wirings. When it is determined that there is a pair left un-inspected, the sequence returns to the step S5 to thereby change over the switches and accordingly select another pair of wirings. The steps S6 through S11 are repeated to inspect another pair of wirings, until all the pair of wirings are inspected.

As described above, according to the first embodiment, the magnetic field is applied to the one ends of the first and the second wirings 21a and 21b with the magnetic flux changing with time. Value is detected as to the current induced by the time-changing magnetic field and flowing through the first and the second wirings 21a and 21b. The result of the detection is compared with the current value (reference current value) which is identified in advance with the non-defective reference wiring pattern, so that whether there is a short-circuit in the wiring pattern 2 is judged. That inspection is made with the wiring to be inspected, being connected with each other through a common wiring. Hence, the first embodiment dispenses with the punching step for separating and insulating all the wirings 21 from one another, i.e. the step which is essential to the inspection by the conventional wiring inspection apparatuses and conventional wiring inspection methods. Thus, the apparatus according to the above embodiment enables reduction of cost for manufacturing the printed circuit boards and the like. The apparatus also enables inspection of disconnection or short-circuit of the wirings on a printed wiring board which can not be punched.

The first embodiment is required to provide a warning indicative of a disconnection every time a disconnection is detected (at step S8) or a warning indicative of a short-circuit every time a short-circuit is detected (step S10). Instead of the warning during the course of each inspection, the results of detection may be stored in a memory such as the RAM 62 and an EEPROM to be displayed or printed out all together after inspections are finished for all of the wirings. Alternatively, whether the board 1 is defective or not may be comprehensively determined based on the resultant data of the detection which are stored in the RAM 62. These alternative ideas are applicable to all of the other embodiments which will be described below.

Figure 8:
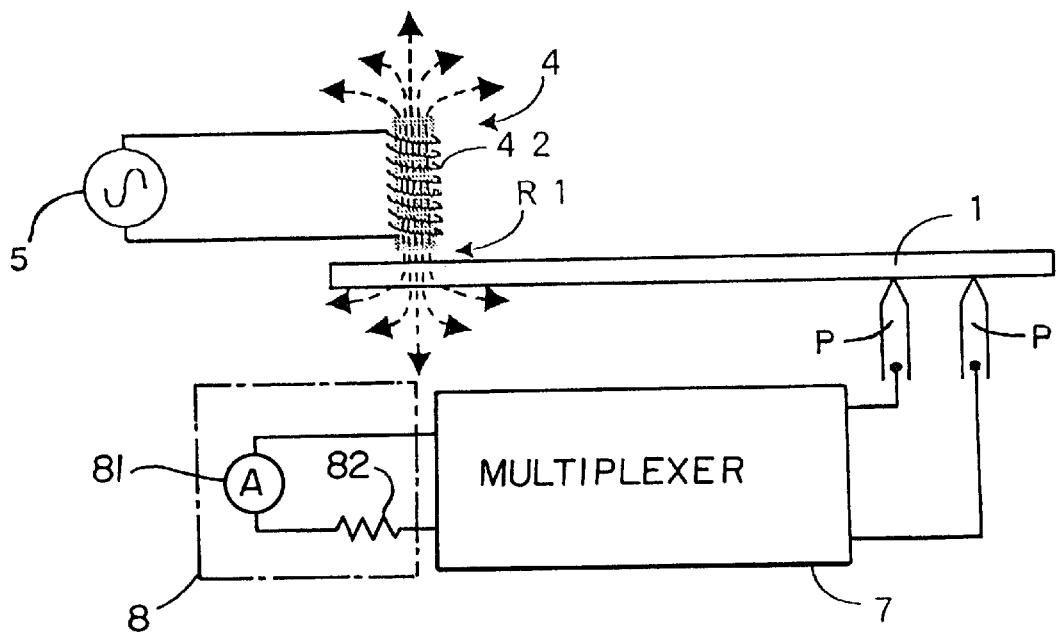
FIG. 8 is a schematic diagram showing a main portion of a second embodiment of a wiring inspection apparatus according to the present invention.

FIG. 8 is a schematic side elevational view showing a second embodiment of a wiring inspection apparatus according to the present invention. A major difference of this wiring inspection apparatus from the first embodiment (FIG. 4) is that a resistor 82 whose resistance Rm is known in advance is connected in the current detector section 8 in addition to the current detector 81 to detect a short-circuit based on a resistance value (short-circuit resistance) at a short-circuit as described later. The wiring inspection apparatus according to the second embodiment is the same as the first embodiment with respect to remaining structure, and hence, the same reference symbols will be assigned to the same structures and a redundant description will be simply avoided.

Figure 9:
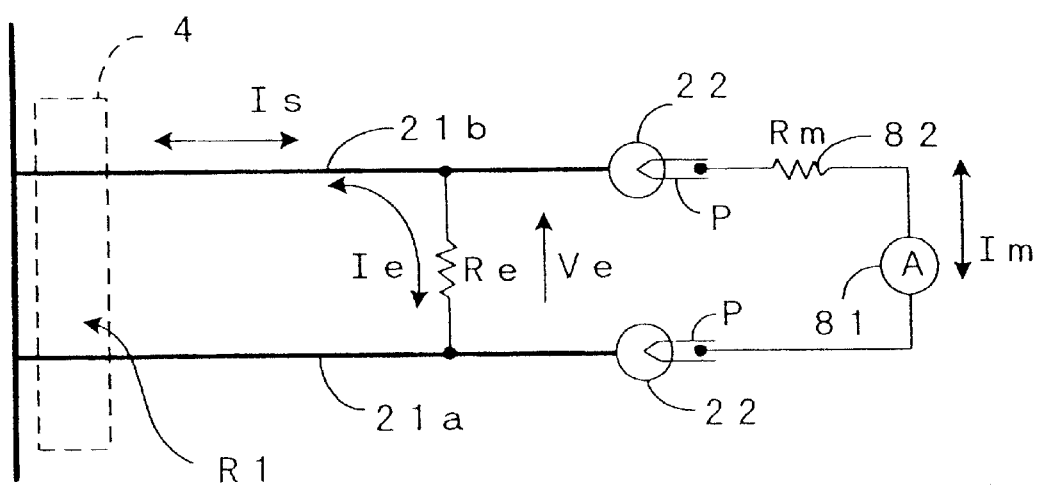
FIG. 9 is a schematic circuit diagram showing operation of the wiring inspection a in FIG. 8.

In the wiring inspection apparatus of the second embodiment, electric current is induced in the circuit including a selected pair of wirings on the board when a magnetic field whose magnetic flux through the region R1 changes with time is applied to the board. If the selected pair of the wirings are short-circuited, a portion of the induced current shunts to the short-circuit as shown in FIG. 9. A current value Im which is detected by the current detector 81 is therefore:

$$Im=Is-Ie \tag{1}$$

where Is: value of induced current and Ie: value of current flowing through the short-circuit. The equation (1) is modified into:

$$Ie=Is-Im \tag{2}$$

Assuming that the value of a voltage across the resistor of the short-circuiting line is Ve, the voltage value Ve is:

$$Ve=Re \times Ie=Rm \times Im \tag{3}$$

where Re: resistance of the short-circuiting line (herein referred to as short-circuit resistor).

The short-circuit resistance Re can be expressed by:

$$Re=Rm \times Im/Ie \tag{4}$$

Substituting the equation (2) in the equation(4), the following equation is obtained.

$$Re=Rm \times Im/(Is-Im) \tag{5}$$

When the same magnetic field is applied to the magnetic field applied region R1 of a non-defective printed wiring board (i.e., a typical example of such a board is the reference wiring board used in the first embodiment), the current value Im detected by the current detector 81 is:

$$Im=Is \tag{6}$$

Thus the value of the induced current is directly obtained.

Hence, the short-circuit resistance Re is obtained by a circuit board inspection process as will be described below, so that the short-circuit is detected more accurately. In the following, sequence for such inspection will be described in detail with reference to FIG. 10.

Figure 10:
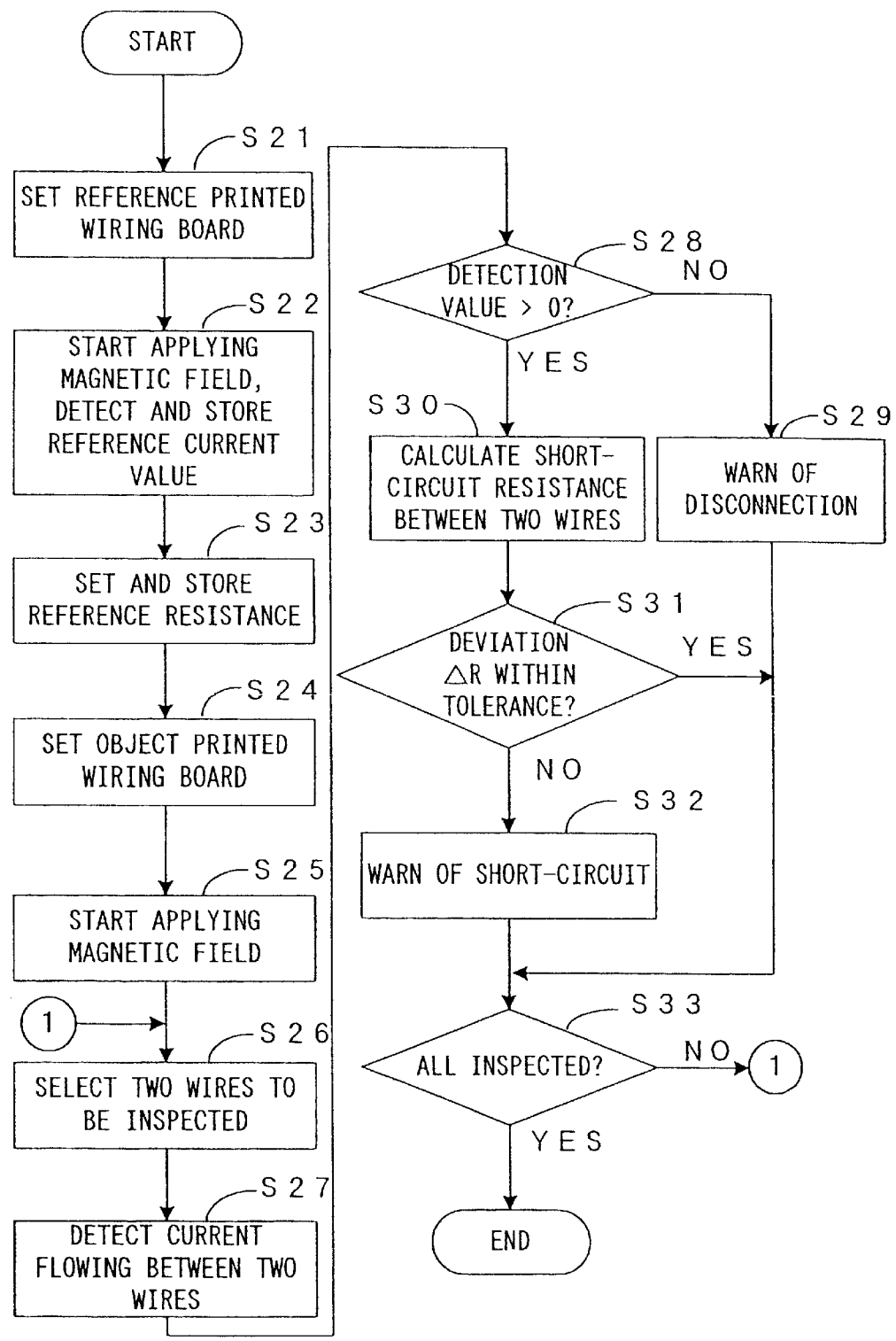
FIG. 10 is a flow chart showing an operation of the wiring inspection apparatus shown in FIG. 8.

FIG. 10 is a flow chart showing the sequence of the inspection process for the wiring inspection apparatus shown in FIG. 8 to inspect a printed wiring board. First, as in the first embodiment, a reference printed wiring board with a non-defective wiring pattern is prepared and set to the wiring inspection apparatus (step S21). Thereafter the magnetic field applying portion 4 applies magnetic field to the magnetic field applied region R1 with the magnetic flux changing with time, whereby current is induced in the wirings on the board. The induced current flows through two probes P and P into the current detector section 8 in which the current detector 81 measures the value Im of the current. Since all the induced current flows into the detector 81, the value Im of the current detected in this manner is substantially equal to that of the induced current, and the RAM 62 stores this value as "the reference current value" (step S22).

When the storage of the reference current value is completed as described above (step S22), an operator inputs, through an operational panel, a reference resistance value which serves as a criteria for deciding whether there is a short-circuit or not, and the data of the reference resistance value is written in the RAM 62, the EEP ROM 63 or the like (step S23). The reference resistance value, as described later, is a value to be compared with a short-circuit resistance. It is judged that there is a short-circuit when the short-circuit resistance is smaller than the reference resistance value, whereas it is judged that there is a short-circuit when the two resistance values are in the reverse relationship to each other.

After the preparatory step as described above (detection and storage of the reference) is completed, the reference printed wiring board is removed from the inspection apparatus, and an object printed wiring board to be inspected is set to the inspection apparatus (step S24). Thereafter the controller 6 supplies the press instruction signal to the pressing mechanism so that the seven conductive spring probes are pressed against the ball grids 22 of the corresponding wirings 21.

Further, the controller 6 sends a positioning instruction signal to the XY positioning mechanism (not shown but known per se in the art) to thereby align the magnetic field applying portion 4 right above the magnetic field applied region R1. Then the controller 6 supplies a control signal to the A.C. current generator 5. In response to the control signal, the A.C. current generator circuit 5 starts supplying A.C. current to the coil so as to apply a magnetic field to the magnetic field applied region R1 (step S25). The controller 6 thereafter provides the multiplexor 7 with the selection instruction signal to select a first pair of probes P1 and P2, for instance, whereby the probes P1 and P2 out of seven probes P1 through P7 are connected with the current detector section 8 (step S26). As a result, a closed circuit is formed by the current detector section 8, the multiplexor 7, the two selected probes P1 and P2, the first and the second wirings 21a and 21b which are connected with the two probes P1 and P2, and the temporary common wiring 3.

Electric current is induced in the closed circuit by the magnetic flux changing with time and applied to the magnetic field applied region R1. If no disconnection exists in the first and the second wirings 21a and 21b, the current detector 81 of the current detector section 8 detects a current of the value which is substantially equal to the value of all the induced current (step S27). In contrast, if there is a disconnection in at least one of the first and the second wirings 21a and 21b, the value detected by the current detector 81 is zero since the closed circuit is not formed.

Therefore, whether there is a disconnection in the first and the second wirings 21a and 21b is detected at the step S28 in accordance with whether the value detected by the current detector 81 is larger than zero like as at the step S7 in the first embodiment. That is, when it is determined "NO" at the step S28, the inspection apparatus detects that at least one of the first and the second wirings 21a and 21b includes a disconnection, and therefore, a display panel (not shown) shows a disconnection warning or a warning message is provided at a step S29.

When it is determined "YES" at the step S28, representing that there is no disconnection in the first and the second wirings 21a and 21b, the sequence proceeds to a step S30 to calculate the short-circuit resistance Re based on the equation (5) (step S30). More in detail, a reference resistance value Rm of the resistor Rm and the reference current value Is stored in advance are read from the RAM 62, the ROM 63 or the like, and the value of the current detected by the current detector 81 is entered for Im in the equation (5) to calculate the short-circuit resistance Re.

Whether there is a short-circuit in the wirings 21a and 21b is determined at the step S31 in accordance with whether the difference $\Delta R$ between the short-circuit resistance Re and the reference resistance value is within a tolerance. When the difference $\Delta R$ is not within the tolerance, it is determined that there is a short-circuit, and the sequence proceeds to a step S33 where the display panel shows the disconnection warning or the warning message is provided (step S32). When it is judged that the difference $\Delta R$ is within the tolerance, determination is made that there is no short-circuit and the sequence proceeds to the step S33.

At step S33, it is judged whether the inspection of disconnection and the short-circuit described above have been finished for all pairs of adjacent wirings. When it is judged that all the pairs have been inspected, the inspection process is finished. When there are pairs of wirings to be inspected, the sequence returns to the step S26 wherein the switches are changed over to select a different pair of wirings. The steps S27 through S33 are thereafter repeated, while a pair of wirings to be inspected still remains.

As described above, according to the second embodiment, a magnetic field is applied to the one ends of the first and the second wirings 21a and 21b with the magnetic flux changing with time. The value of a current flowing between the first and the second wirings 21a and 21b is detected. After the short-circuit resistance Re is calculated, the result of the calculation is compared with the reference resistance value which is set in advance, whereby whether the wiring pattern 2 includes a short-circuit is determined. Hence, as in the first embodiment, a printed circuit board is inspected while the temporary common wiring 3 is left unremoved. This dispense with the punching step for insulating each wiring 21 from the temporary common wiring 3 and which is essential to the inspections by the conventional wiring inspection apparatuses and the conventional wiring inspection methods. Thus the second embodiment also enables reduction of manufacturing cost for the printed circuit board. This also enables inspection of a disconnection and/or short-circuit in a printed wiring board which can not be punched.

Although the foregoing has been described as to the first and the second embodiments wherein a printed wiring board to be inspected has a wiring pattern 2 whose seven wirings 21 are electrically connected one another on the one ends side, the wiring inspection apparatuses and the wiring inspection methods according to the present invention are generally applicable to the inspection of various types of printed wiring boards including a wiring pattern in which two or more wirings are electrically connected at one ends to each other.

Further, although a width W of the core 41 at the front end portion of the core 41 is increasingly smaller, in the above mentioned embodiments, toward the board 1 in a direction Y which is perpendicular to the direction X in which wirings 21 extend, the shape of the core 41 is not limited to this but may be shaped in a flat plate. Still, if the core 41 is shaped as described in relation to the first and the second embodiments, the magnetic field applied region R1 may be narrowed. This is advantageous with respect to the following. That is, the wiring pattern 2 on the board 1 has become extremely fine over the recent years. If the magnetic field applied region R1 extends to a large area, a magnetic field spreads even into a region which is not relevant to inspection, in which case the accuracy of the inspection deteriorates. If the magnetic field applied region R1 is restrained to be small, however, such a problem is avoided.

Figure 11:
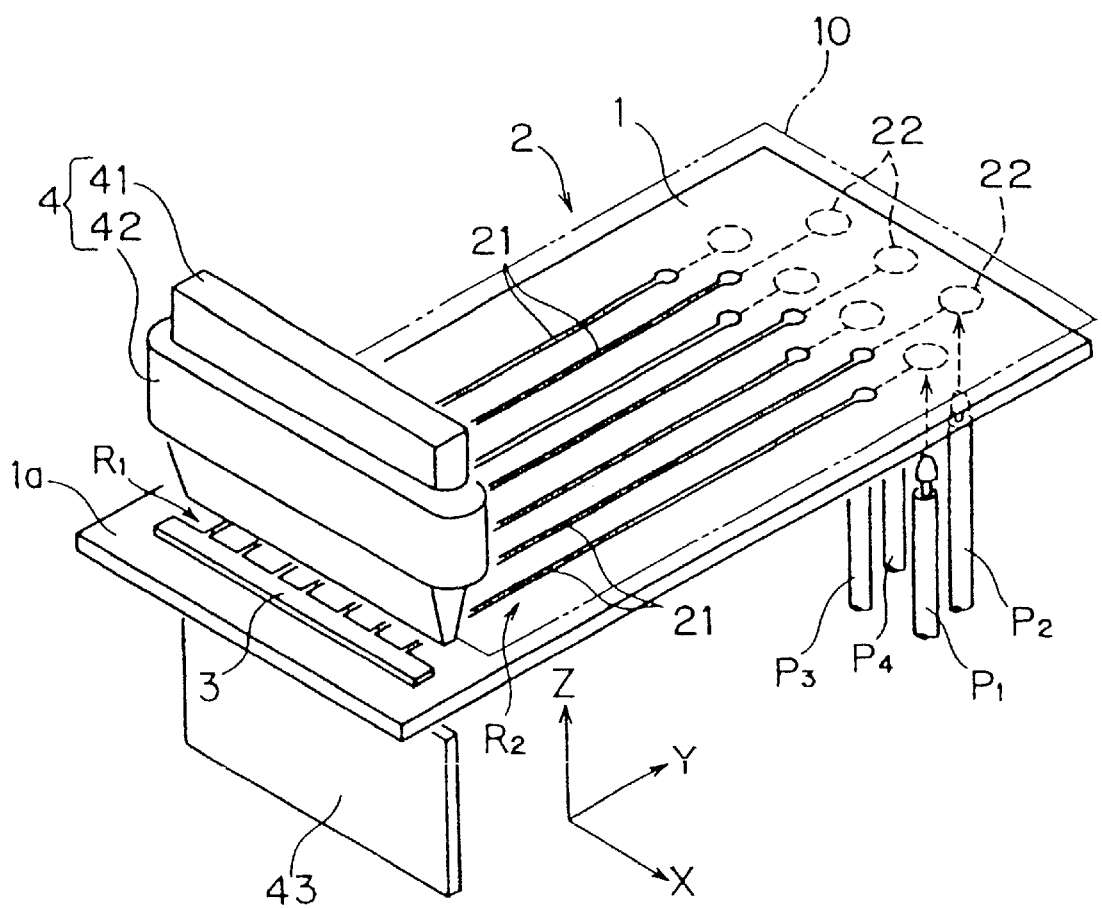
FIG. 11 is a perspective view showing a construction of a wiring inspection apparatus modified from those of the first and the second embodiments.
Figure 12:
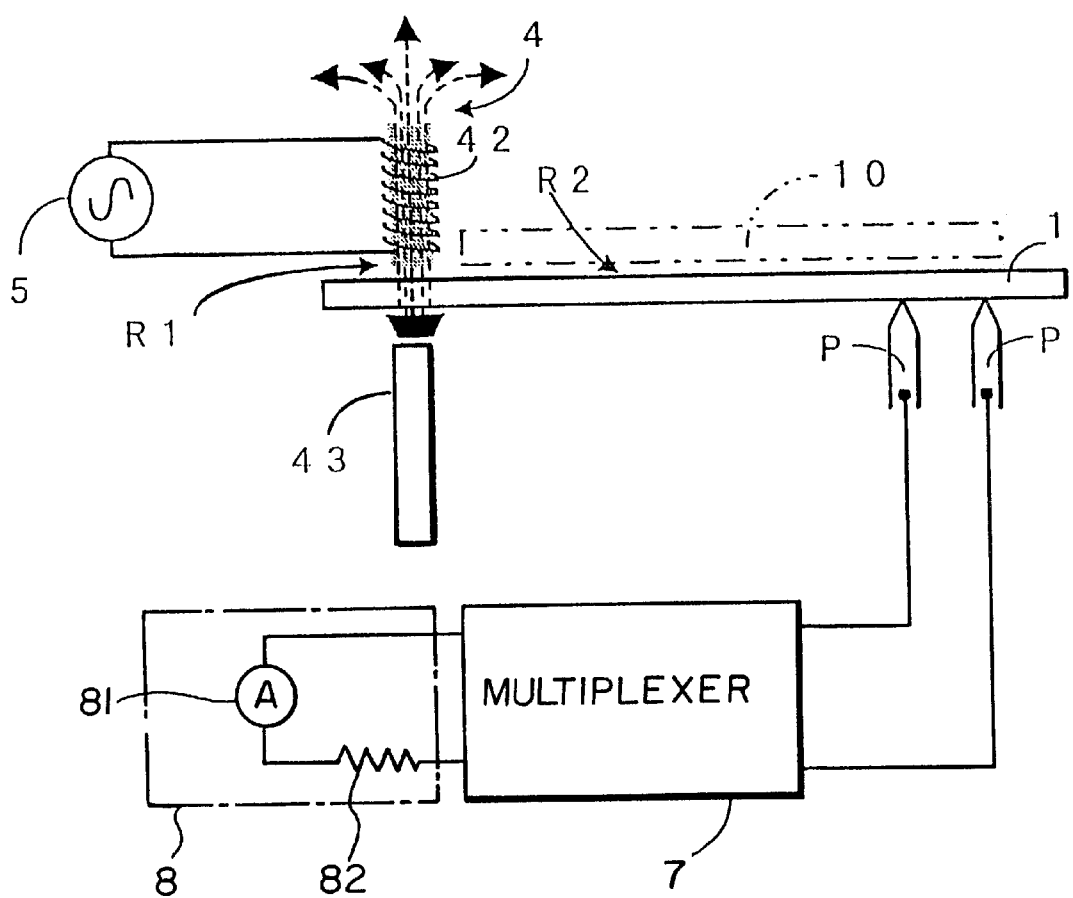
FIG. 12 is a schematic diagram for showing operation of the wiring inspection apparatus shown in FIG. 11.

An alternative approach to restrict the magnetic field applied region R1 is to dispose a magnetic field guiding member 43 which is formed of a magnetic material and is located on the opposite side of the board 1 from the magnetic field applying portion 4, as shown in FIGS. 11 and 12. Further, as the magnetic field guiding member 43 is extended in the direction Z, normal to the board 1, the magnetic flux through the magnetic field applied region R1 run along the direction Z. The guiding member 43 absorbs the flux and accordingly suppresses or control expansion of the magnetic field into a region R2 which is adjacent to the magnetic field applied region R1. Thus, the adoption of the guiding member 43 is advantageous to an improvement of the inspection accuracy.

Further, for the purpose of improving the inspection accuracy by preventing the magnetic flux from expanding beyond the magnetic field applied region R1, as shown in FIG. 11 and 12, a shield plate 10 formed of a magnetic material may be disposed over the region R2 above the board 1, i.e., the right-hand side in FIGS. 11 and 12. Alternatively, the shield plate 10 may be disposed on the back surface side. With the shield plate 10 disposed facing the region R2, or facing the region R2 across the board 1 as described above, a shielding effect is brought about on the region R2 and generation of an excessive induced current in the wirings 21 is prevented so that accuracy of the inspection accordingly improves.

However, if the shield plate 10 is too close to the magnetic field applying portion 4, the magnetic flux from the magnetic field apply portion 4 is partially absorbed by the shield plate 10. In other words, the shield pate 10 and the magnetic field applying portion 4 form a magnetic circuit. Therefore, it is necessary to dispose the shield plate 10 off the magnetic field applying portion 4 by a distance which is enough to prevent a substantial decrease in the density of the magnetic flux to be applied the magnetic field applied region R1.

As the magnetic material which form the magnetic field guiding 43 and the shield plate 10, it is preferable to employ a soft magnetic material such as permalloy, ferrite and silicon steel which have a high permeability.

While the column-like shaped core 41 is used as a core member of the magnetic field applying portion 4 in the first and the second embodiments, the shape of the core may be a C-letter shape, a U-letter shape, a horseshoe shape, or a semicircular shape, in vertical side cross-section for example. When the core is shaped in such an improved shape, an even more efficient magnetic circuit is obtained. In the following, an improvement to the magnetic field applying portion 4 will be described with reference to FIGS. 13 through 18.

Figure 13:
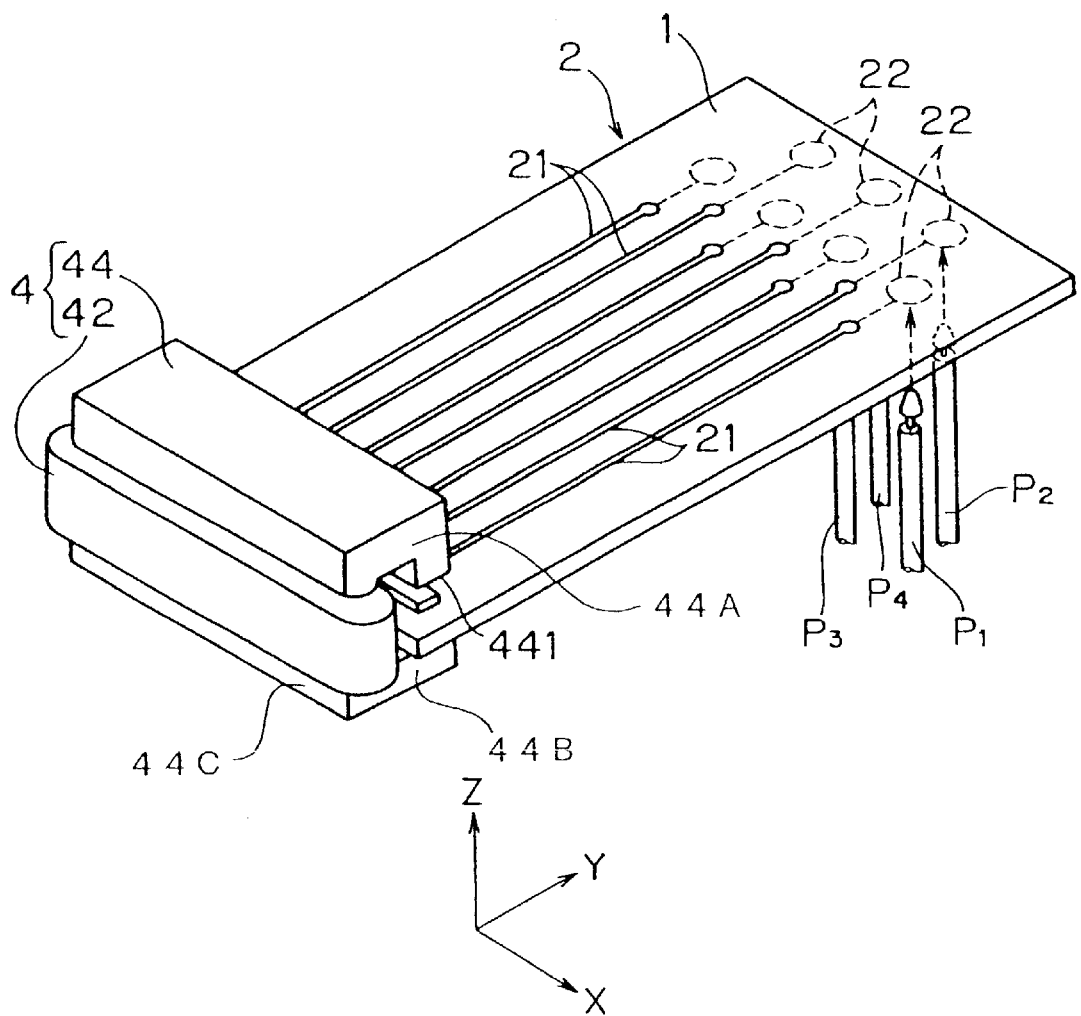
FIG. 13 is a perspective view showing a third embodiment of a wiring inspection apparatus according to the present invention.
Figure 14:
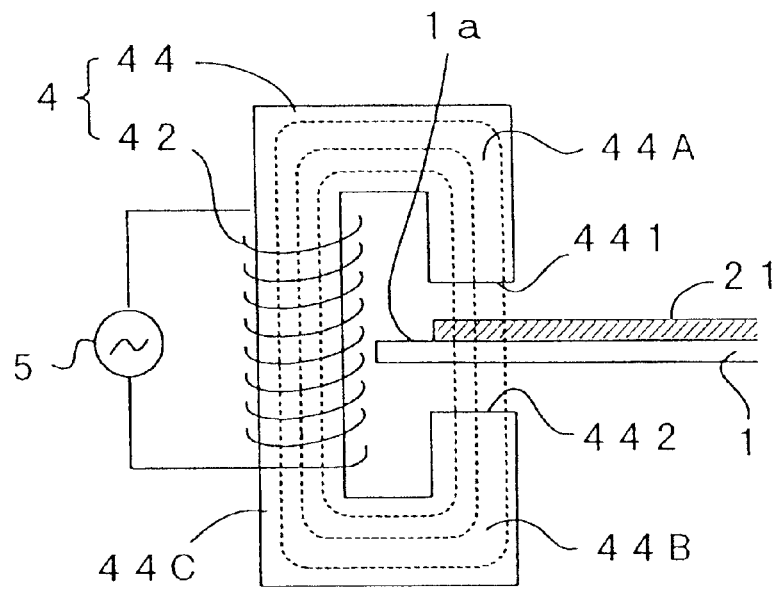
FIG. 14 is a partial side view of the apparatus shown in FIG. 13.

FIG. 13 is a perspective view showing a third embodiment of a wiring inspection apparatus according to the present invention, and FIG. 14 is a partial side view of the apparatus shown in FIG. 13. The third embodiment employs a core 44 which is approximately C-letter shaped in transverse cross section. The core 44 comprises a first leg portion 44A which has a first end surface 441, a second leg portion 44B which has a second end surface 442, and a link portion 44C which links the two leg portions to each other. The first end surface 441 of the core 44 is positioned above the principal surface 1a of the board 1 in such a manner that the first end surface 441 confronts and extends transversely over the one ends of all wirings 21 as in the first embodiment, whereas the second end surface 442 is disposed to oppose the first end surface 441 via the board 1. In other words, the board 1 is sandwiched between the surfaces 441 and 442. The coil 42 is wound around the link portion 44C of the core 44. Hence, as the A.C. current generation circuit 5 supplies the signal to the coil 42 of the magnetic field applying portion 4 to generate a magnetic field, the magnetic flux, as shown at the dotted line in FIG. 14, mostly runs through the core 44 which has a high permeability. With the electromagnetic construction as mentioned above an efficient magnetic circuit is formed. This consequently improves the level of the current induced by the applied magnetic field, thereby enhancing the accuracy of an inspection.

Figure 15:
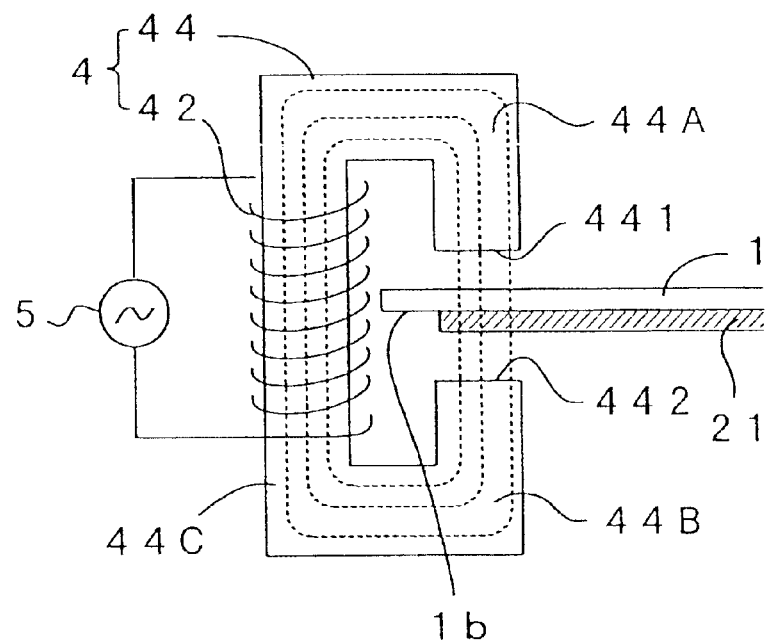
FIG. 15 is a side view showing a modification for the third embodiment.

Although the third embodiment is arranged to inspect the wirings 21 formed on the principal surface of the board 1 with the first end surface 441 confronting the wirings, face the first end surface 441, it is possible to inspect a wiring pattern in exactly the same manner as in the third embodiment even when the wirings 21 are formed on the bottom or opposite surface 1b as shown in FIG. 15. This holds true in the first and the second embodiments as described earlier and also in other embodiments described below.

Figure 16:
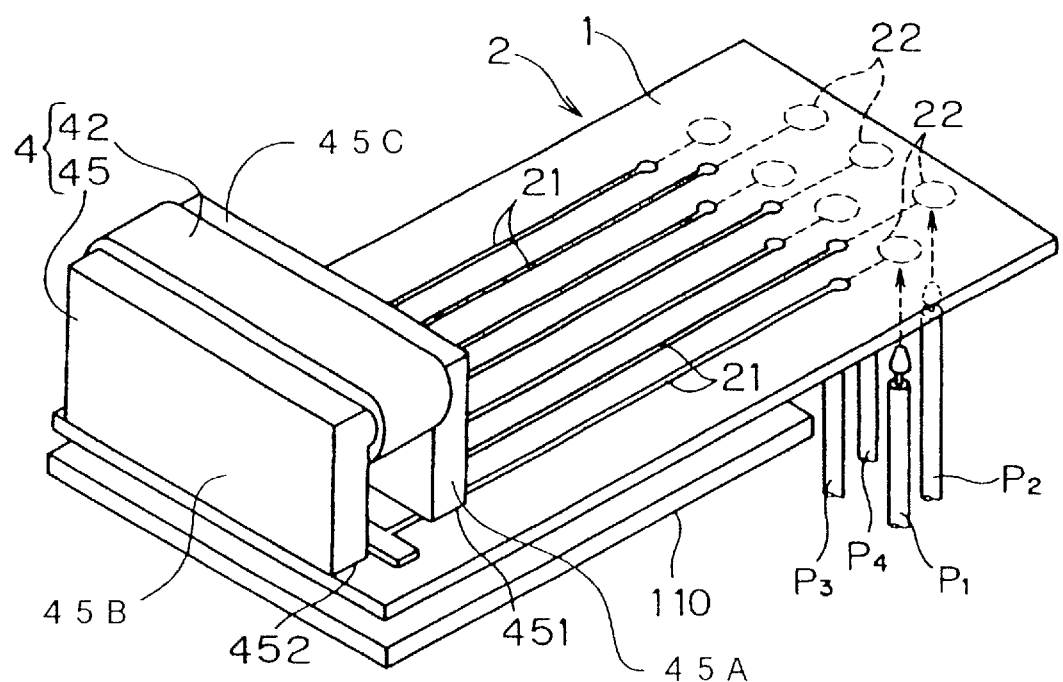
FIG. 16 is a perspective view showing a main portion of a fourth embodiment of a wiring inspection apparatus according to the present invention.
Figure 17:
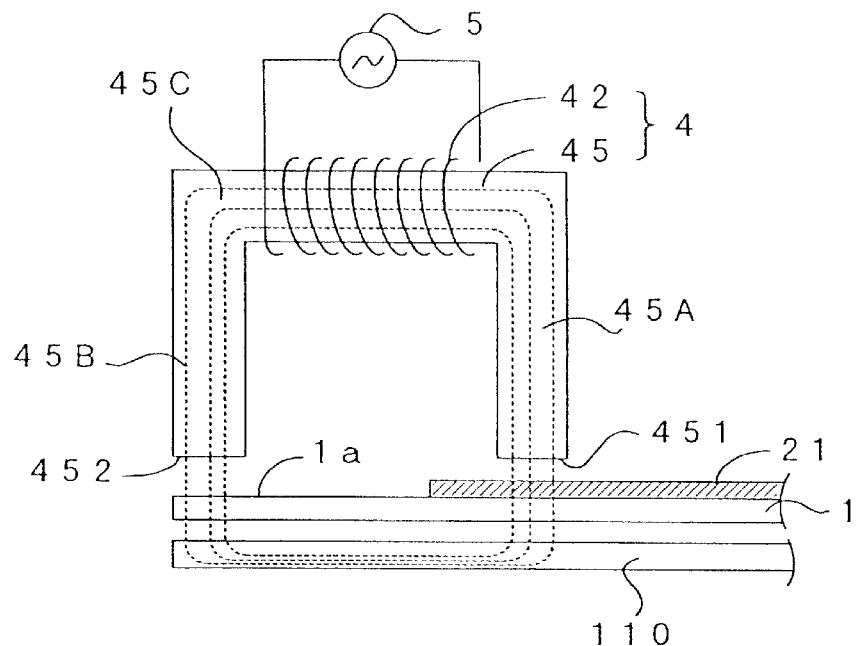
FIG. 17 is a partial side view of the apparatus shown in FIG. 16.

FIG. 16 is a perspective view showing a fourth embodiment of a wiring inspection apparatus according to the present invention, and FIG. 17 is a partial side elevational view of the apparatus shown in FIG. 16. The fourth embodiment employs a core 45 which is an approximately reversed U-letter shaped in transverse elevational cross section. The core 45 comprises a first leg portion 45A which has a first end surface 451, a second leg portion 45B which has a second end surface 452, and a link portion 45C which links the two leg portions to each other. Although the leg portions 45A, 45B and the link portion 54C are approximately at right angles to each other in the fourth embodiment, the link may be curved. The term "approximate U-letter shape" refers not only to a U-shape as literally interpreted but also any various shapes including bottom open square shape, semi-circle, Ω shape and so forth.

The first end surface 451 of the core 45 is at an open end side of the U-letter shaped core 45, facing the principal surface 1a of the board 1 in such a manner that the first end surface 451 transversally extends over the one ends of all wirings 21 as in the first embodiment. The second end surface 452 as well faces the principal surface 1a of the board 1. The fourth embodiment requires that the core 45 is positioned such that the second end surface 452, in particular, faces a region which does not bear the wirings 21. The coil 42 is wound around the link portion 45C of the core 45.

On the other hand, a magnetic path generation plate 110 which is shaped like a flat panel is disposed under the board 1 in parallel with the board 1, opposing the core 45 via the board 1. The magnetic path generation plate 110 is formed of a soft magnetic material such as permalloy, ferrite and silicon steel which have a high permeability. Hence, as the A.C. current generation circuit 5 supplies A.C. current to the coil 42 of the magnetic field applying portion 4 to generate a magnetic field as shown at the dotted line in FIG. 17, the magnetic flux mostly travels through the core 45 and the magnetic path generation plate 110 of high permeability which form a highly efficient magnetic circuit. This magnetic circuit consequently improves the level of the current induced by the applied magnetic field, and enhances the accuracy of an inspection.

Figure 18:
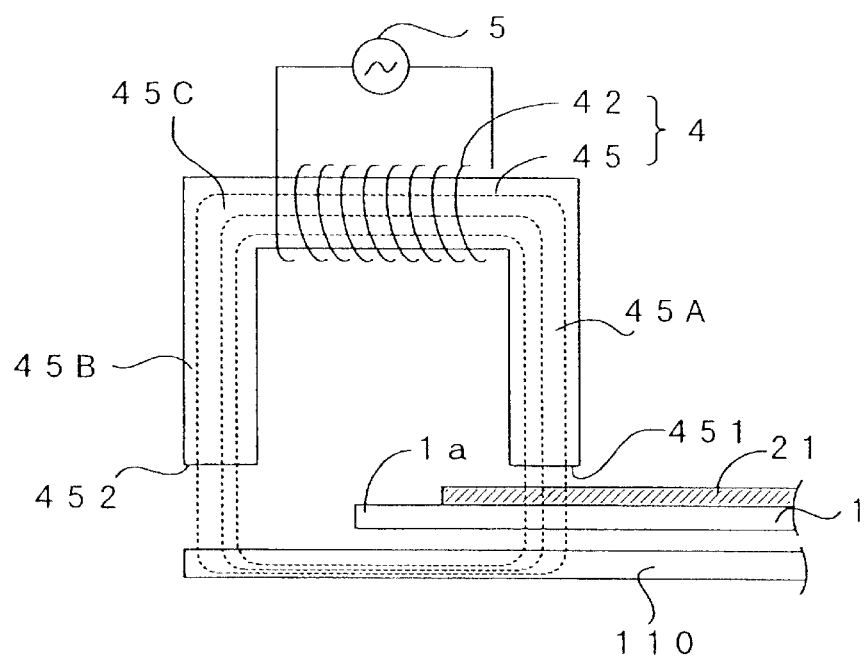
FIG. 18 is a side view showing a modification from the fourth embodiment.

The second end surface 452 faces the area of the board where the wirings 21 are not formed, to prevent, generation of an excessive induced current through the wirings 21 thereby improving the accuracy of an inspection. Further, the panel-like member for developing the magnetic path reduces the space below the board which was occupied by the magnetic path generation member in the foregoing embodiments, thereby facilitating designing of the apparatus. Alternatively, as shown in FIG. 18, the core 45 may be positioned such that the second end surface 452 directly faces the magnetic path generation plate 110.

Figure 19:
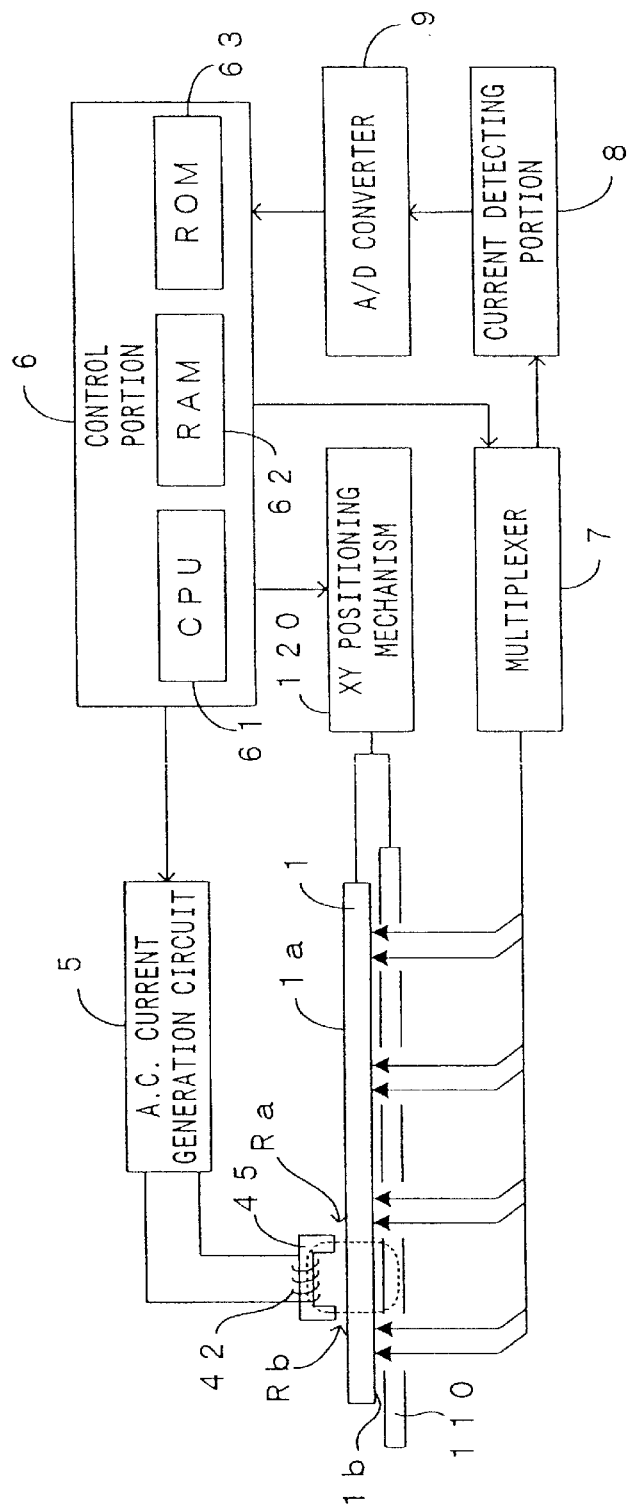
FIG. 19 is a schematic illustration and block diagram showing a fifth embodiment of a wiring inspection apparatus according to the present invention.

FIG. 19 is a block diagram showing a fifth embodiment of a wiring inspection apparatus according to the present invention. The inspection apparatus for inspecting wirings on a board comprises an XY positioning mechanism 120 which moves the board 1 within an XY plane just below the magnetic path generation plate 110 which is disposed together with the board 1. Meanwhile, the magnetic field applying portion 4 which has a structure as shown in FIGS. 16, 17 or FIG. 18 is fixedly disposed above the board 1. Hence, as the XY positioning mechanism 120 operates in accordance with the control signal from the controller 6, the board 1 and the magnetic path generation plate 110 is moved as one unit, whereby the board 1 is positioned relative to the core 45. In this fifth embodiment, the circuit board 1 to be inspected, is formed with a plurality of circuit patterns or a plurality of circuit board units integrated with one- another. Plural sets of probes are to be electrically connected with respective patterns. For an actual inspection, the board 1 is to be positioned such that the first end surface 451 of the core 45 faces the one ends of the wirings 21 of selected one of the patterns, as shown in FIGS. 17 and 18.

The coil 42 of the magnetic field applying portion 4 is connected with the A.C. current generation circuit 5. The A.C. current generation circuit 5 operates in response to the control signal supplied from the controller 6 to supply the coil 42 with the A.C. current. The A.C. current causes a magnetic field in the magnetic field applying portion 4. A magnetic circuit is formed by the core 45 and the magnetic path generation plate 110 which have high permeability, as shown in FIGS. 17 and 18. The wiring pattern 2 is thereafter inspected as to whether there is a disconnection and/or short-circuit, as in the same manner as in the foregoing embodiments.

The controller 6 provides the multiplexor 7 with a selection instruction signal to connect a pair of probes (i.e., an object wiring pair) with the current detector section 8. As a result, a closed circuit is formed by the current detector section 8, the multiplexor 7, the two selected probes, the first and the second wirings which are connected with the two probes, and a temporary common wiring for forming the wiring pattern by electrolytic plating. Whether there is a disconnection or short-circuit in the object wiring pair is inspected based on monitoring of an induced current flowing through the closed circuit as the time-changing magnetic flux is applied to the magnetic field applied region R1 (FIGS. 17 and 18). The principles of the inspections are exactly the same as in the first and the second embodiments, and therefore, will not be described again.

When the inspection is completed for one object wiring pair, the switch groups of the multiplexor 7 are changed over to select another pair of wiring, and inspection is repeated until all the pairs have been inspected.

After inspecting one wiring pattern 2, the XY positioning mechanism 120 is manipulated so that another wiring pattern 2 formed on the board 1 is confronted by the core 45. Then the wiring pattern 2 thus selected is thereafter inspected in a similar manner as in the case of the first selected pattern as described above.

As described above, in the fifth embodiment, after the board 1 is moved relative to the magnetic field applying portion 4 to make the core 45 selectively confront one of the wiring patterns on the board 1, whether there is a disconnection or short-circuit in the wiring pattern 2 is judged in the manner as described earlier. Hence, it is possible to successively inspect a plurality of wiring patterns 2, and therefore, to enhance the inspection efficiency.

Figure 22A:
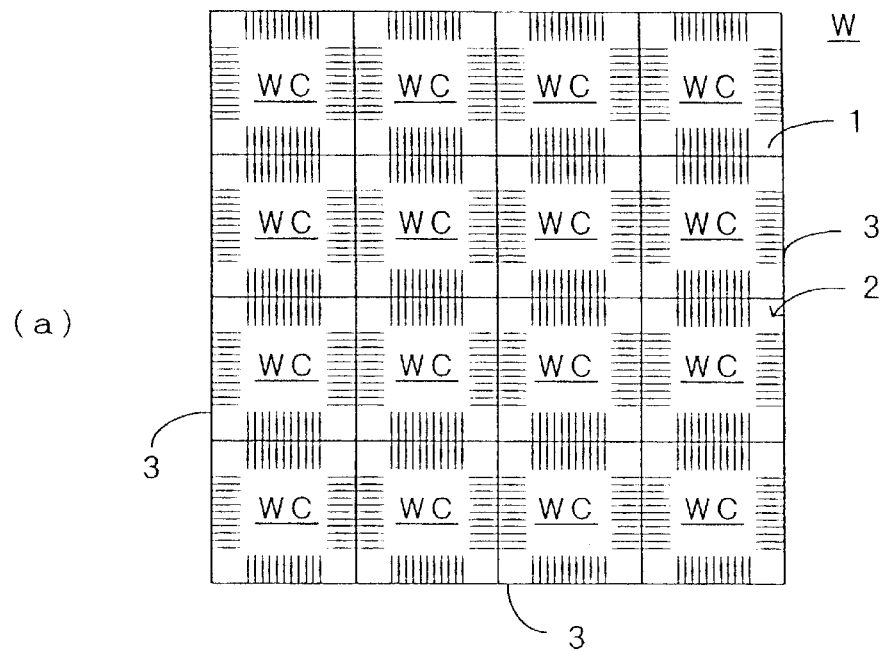
FIGS. 22A and 22B show an example of a work to be inspected by the present invention.
Figure 22B:
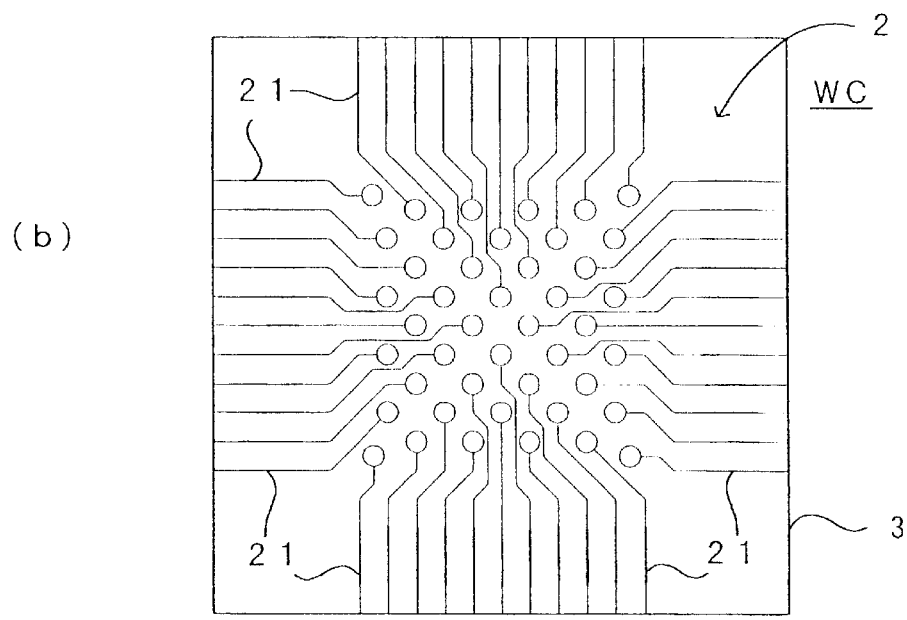

Further, the wiring inspection apparatus according to the fifth embodiment may inspect wirings 21 of each work piece WC of the work shown in FIGS. 22A and 22B without separating the work pieces WC from one another. Still further, the above mentioned inspection of integral work pieces enables installation of circuit components on the work pieces WC while the work pieces WC are integrated in a work W. More specifically, a series of circuit board assembling processes as. described below, is made with the integral work W.

First, a plurality of same wiring patterns 2 are formed in a matrix on the board 1 to obtain a work W composed of work pieces WC. After the work W is set to the wiring inspection apparatus shown in FIG. 19 at a predetermined position, whether the wirings 21 of each work piece WC are defective is inspected with the XY positioning mechanism 120 changing the relative position of the circuit board 1 and the core 45 to make the latter selection confront one of the patterns. Then, circuit components such as a semiconductor, IC, resistors, etc. are mounted on each of work pieces WC which are determined non-defective, and the work pieces WC are thereafter cut off from each other. In consequence, chip-like electronic components are obtained which are to be incorporated in electronic apparatuses. This realizes an excellent effect that it is possible to manufacture and assemble electronic components efficiently.

Although the foregoing has been described that the wiring patterns 2 are formed in a matrix as shown in FIG. 22A, for example, the present invention is applicable to a work in which wiring patterns different from each other are formed on the board 1.

While the fifth embodiment employs the core 45 of the shape as shown in FIG. 16, the foregoing embodiments core 41 or 44 may be used well for successive inspection of the wiring patterns of a plurality of work pieces WC which are integral as a board 1, in a similar manner described above. However, the core 45 shown in FIG. 16 can be used in a unique way as described below. Now, the unique way will be described with reference to FIG. 20.

Figure 20:
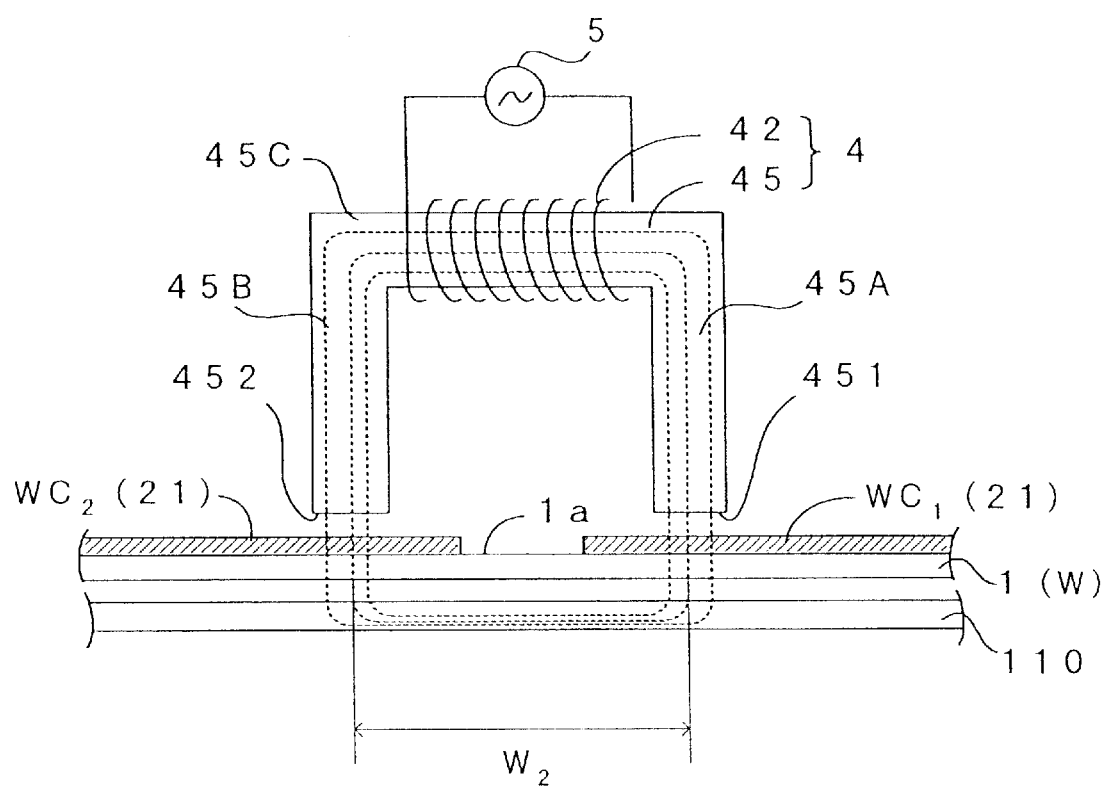
FIG. 20 is an enlarged view showing an improvement from the fifth embodiment of the present invention.
Figure 21:
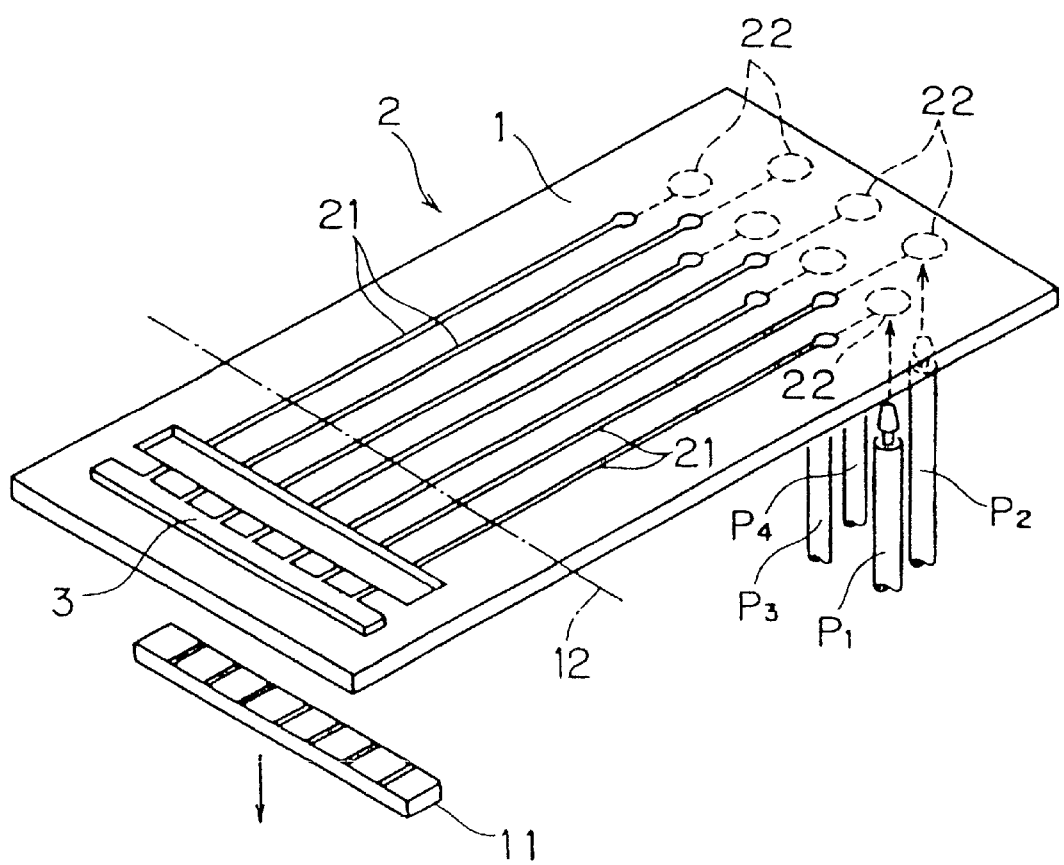
FIG. 21 is a for showing a conventional method for inspecting a printed wiring board.

FIG. 20 shows an improvement from the fifth embodiment of the present invention. The improvement that the two end surfaces 451 and 452 of the core 45 at a predetermined distance W2 from each other, respectively face the magnetic field applying portions of the respective work pieces WC1, WC2 of the board 1 (work W). Hence, as the board 1 and the magnetic path generation plate 110 are moved as one unit relative to the core 45, the first end surface 451 confronts the wirings 21 of the work piece WC1 and the second end surface 452, at the same time, confronts the wirings 21 of the work piece WC2, as shown in FIG. 20. After that positioning, the inspection probes are pressed against the ball grids of the wirings of the work pieces WC1 and WC2 and the A.C. current generation circuit 5 operates in response to the control signal from the controller 6, to supply the coil 42 with the A.C. current. The A.C. current causes generation of a magnetic field at the magnetic field applying portion 4. At this time, a magnetic circuit is formed by the core 45 and the magnetic path generation plate 110 which have high permeability, as shown in FIG. 20. The wirings 21 of the work piece WC1 consequently is intersected by the magnetic flux at the magnetic field applied region Ra while the wirings 21 of the work piece WC2 is intersected by the magnetic flux in a magnetic field applied region Rb.

In the improved embodiment, after the first inspection of whether there is a disconnection or short-circuit in the wirings 21 of the work piece WC1, whether there is a disconnection or short-circuit in the wirings 21 of the work piece WC2 is inspected without moving the board 1. It is thus possible in the improved embodiment to continuously inspect the wirings of the two work pieces WC1 and WC2 with the board 1 positioned only once, which in turn improve the efficiency of the wiring inspection and reduce an inspection time.

Upon the inspection on a pair of work pieces WC1 and WC2 in the manner described above, the board 1 is move to make the core 45 confront a different pair of work pieces, which are inspected in a similar manner as described above. Such an operation is repeated until all the work pieces are inspected.

Although the fifth embodiment and its improved embodiment described above are required to move the board 1 for the purpose of positioning it relative to the magnetic field applying portion 4, the magnetic field applying portion 4 may be moved instead while the board 1 is fixed. Alternatively, both the board 1 and the magnetic field applying portion 4 may be moved to relatively position the board 1 and the magnetic field applying portion 4.

In addition, although the fifth embodiment and its improved embodiment described above require that end surfaces 451 and 452 of the core 45 respectively confront a pair of adjacent work pieces, the apparatus may be constructed such that the end surfaces of the core respectively confront work pieces which are remote from each other, e.g., with one work piece or more interposing therebetween. Relationship of the end surfaces of the core 45 relative to the core 45 may be positioned in accordance with the size of the work pieces, the shapes of the wiring patterns on the work pieces, distances between the magnetic field applying portions in particular, and sizes of or a distance between the end surfaces of the core which are determined based on designing.

Further, although the improved embodiment described above can sequentially inspect the work pieces WC1 and WC2 one at a time after positioning the work pieces WC1 and WC2 relative to the core 45, the wirings of both the work pieces WC1 and WC2 may be inspected at the same time since a magnetic field is applied to the work pieces WC1 and WC2 at the same time as the coil 42 receives the A.C. signal. That is, two sets of detection means (the multiplexor 7, the current detector section 8, and the A/D converter 9) for detecting an induced current through the wirings 21 may be prepared for that purpose. This arrangement allows to simultaneously detect induced currents which flow in the wirings 21 of the work pieces WC1 and WC2 and simultaneously judge whether the wirings 21 of the work pieces WC1 and WC2 are defective based on the detection results, which further reduces a time necessary for inspecting the wirings 21. However, since this demands two detection means, the improved embodiment described above is superior in terms of a cost of the apparatus.

The present invention is not limited to the embodiments described above. To an extent not to depart from the spirit and aim of the present invention, various other modifications and changes are possible in addition to those described above. For example, while the printed wiring board 1 is inspected in the embodiments described above, other boards, such as flexible boards and multi-layer wiring boards, can be inspected according to the present invention. Further, the present invention is applicable to a glass substrate for a liquid crystal display or a plasma display has a wiring pattern which is formed by more than one transparent electrodes. The present invention is also applicable to a film carrier for a semiconductor package and which seats a wiring pattern. In the meantime, although a lead frame is obtained by pressing or otherwise appropriately processing a thin metallic plate of an iron-nickel alloy, a copper alloy or the like, and hence, like a printed wiring board and a glass substrate for a liquid crystal display, does not comprise a board or a substrate but comprises a wiring pattern which is defined by a plurality of wirings whose one ends are electrically connected to each other. Hence, when the present invention is applied to a lead frame, it is possible to inspect the wiring pattern of the lead frame.

Further, although the magnetic flux is changed with time with the A.C. current being supplied to the magnetic field applying portion 4 in the embodiments described above, the A.C. signal may have an optional configuration such as a sinusoidal waveform, a triangular waveform, a trapezoidal waveform and a rectangular waveform. Still further, a D.C. signal may be supplied to the magnetic field applying portion 4 instead of the A.C. signal and the electric potential of the D.C. signal may be changed step-wise or pulse-wise so that the magnetic flux changes instantaneously.

Moreover, although the ball grids 22, which are formed on the back surface of the board 1 as shown in FIG. 1, for example, are engaged by and electrically connected with the conductive spring probes P in the embodiments described above, the probes P may be pressed against the ball grids 22 on the front surface side of the board 1 if the ball grids 22 are formed on the front surface of the board 1.

In addition, although a disconnection and a short-circuit are items for a judgement to determine whether a wiring pattern is defective or not in the embodiments described above, whether there is only either one of a disconnection and a short-circuit may be inspected instead.

What is claimed is:

1. A wiring inspection apparatus for inspecting wirings of a board, including first and second wirings, each of which has first and second ends, in a condition that both first ends of said first and second wirings are electrically coupled to each other, comprising:

magnetic field applying means for applying a magnetic field to said first and second wirings on the first ends side of said first and second wirings;

magnetic field controlling means for supplying a signal to said magnetic field applying means so that the magnetic flux of the magnetic field changes with time;

current detection means for detecting a current which flows between said first and second wirings as the magnetic flux changes with time; and defect judging means for judging whether said first and second wirings are defective based on a detection result which is obtained by said current detection means.

2. A wiring inspection apparatus in accordance with claim 1, wherein said magnetic field applying means comprises: a core which is entirely formed by a soft magnetic material and includes a first leg portion with a first end surface, a second leg portion with a second end surface and a link portion which links said leg portions to each other; and a coil which is wound around said core, and the first end surface is located over the first ends of said first and second wirings on one side of a board in which the first ends of said first and second wirings are formed on the same plane, and on the other side of said board, the second end surface is located facing the first end surface across said board.

3. A wiring inspection apparatus in accordance with claim 1, wherein said current detection means comprises specified resistor means whose resistance is known in advance and a current detector, and said specified resistor means and said current detector are connected in series between the second ends of said first and second wirings.

4. A wiring inspection apparatus in accordance with claim 1, further comprising a magnetic path generation plate which is formed by a soft magnetic material, wherein said magnetic field applying means comprises: a core which is entirely formed by a soft magnetic material and includes a first leg portion with a first end surface, a second leg portion with a second end surface and a link portion which links said leg portions to each other; and a coil which is wound around said core, and said core is disposed on one side of a board in which the first ends of said first and second wirings are formed on the same plane while said magnetic path generation plate is disposed parallel to said board on the other side of said board so that the magnetic flux which exits at one of the two end surfaces of said core is guided to the other one of the two end surfaces of said core, whereby a magnetic circuit is formed.

5. A wiring inspection apparatus in accordance with claim 4, wherein said board is structured as a work in which a plurality of work pieces are formed continuous and integrated with each other in a plane, the first and second end surfaces of said core are spaced sufficiently to be faced with first ends of said wirings of different ones of said work pieces, and whether each one of said work pieces with which the end surfaces of said core are faced is defective or not is judged.

6. A wiring inspection apparatus in accordance with claim 1, wherein said magnetic field applying means comprises: a core which is formed by a soft magnetic material and has a first end surface and a coil which is wound around said core, and the first end surface of said core is located over the first ends of said first and second wirings.

7. A wiring inspection apparatus in accordance with claim 6, further comprising a guide member for guiding the magnetic field applied from said magnetic field applying means in a predetermined direction and accordingly limits the range of the magnetic field which is applied to said first and second wirings.

8. A wiring inspection apparatus in accordance with claim 6, wherein a portion of said core which is close to the first end surface tapers toward the first end surface in a direction which is approximately perpendicular to a direction in which said first and second wirings are arranged.

9. A wiring inspection apparatus for inspecting wirings of a board, which inspects first and second wirings, each of which has a first end, in a condition that both first ends of said first and second wirings are electrically connected to each other, comprising:

magnetic field generation means for generating a magnetic field;

positioning means for positioning said first and second wirings relative to said magnetic field generation means such that said first and second wirings intersect the magnetic flux of the magnetic field on the first ends side of said first and second wirings;

magnetic field controlling means for supplying a signal to said magnetic field generation means so that the magnetic flux changes with time;

current detection means for detecting a current which flows between said first and second wirings as the magnetic flux changes with time; and defect judging means for judging whether said first and second wirings are defective based on a detection result which is obtained by said current detection means.

10. A wiring inspection apparatus for inspecting wirings of a board, which inspects first and second wirings, each of which has first and second ends, in a condition that both first ends of said first and second wirings are electrically connected to each other, comprising:

current detection means which is inserted between the second end of said first wiring and the second end of said second wiring to thereby form a closed circuit, and which detects a current which flows through the closed circuit;

induced current generation means for generating an induced current within the closed circuit; and defect judging means for judging whether said first and second wirings are defective based on the value of the induced current which is detected by said current detection means.

11. A wiring inspection apparatus in accordance with claim 10, wherein said induced current generation means applies a magnetic field to said first and second wirings on the first ends side of said first and second wirings and changes the magnetic flux of the magnetic field with time so that the induced current is generated within the closed circuit.

12. An apparatus for inspecting wirings of a board which is structured as a work in which a plurality of work pieces are formed continuous and integrated with each other in a plane, said apparatus inspecting first and second wirings, each of which has a first end, in a condition that the first ends of said first and second wirings of each said work piece are electrically connected to each other, comprising:

(a) magnetic field applying means which comprises:

(a-1) a core which is entirely formed by a soft magnetic material and includes a first leg portion with a first end surface, a second leg portion with a second end surface and a link portion which links said leg portions to each other, said core being located on one side to said work, the first and second end surfaces of said core being faced respectively with the first ends of said wirings of different ones among said work pieces;

(a-2) a coil which is wound around said link portion; and (a-3) a magnetic path generation plate which is formed by a soft magnetic material, said magnetic path generation plate being disposed parallel to said work on the other side of said work so that the magnetic flux which exists at one of said end surfaces of said core is guided to the other one of said end surfaces of said core and a magnetic circuit is consequently formed, said magnetic field applying means applying a magnetic field simultaneously to said work pieces which are faced with the first and second end surfaces of said core;

(b) magnetic field controlling means for supplying a signal to said magnetic field applying means so that the magnetic flux of the magnetic field changes with time;

(c) current detection means for detecting a current which flows, in accordance with a change in the magnetic flux, between said wirings of said work pieces which are faced with the first and second surfaces of said core; and (d) defect judging means for judging, with respect to each of the said work pieces which are faced with said first and second end surfaces of said core, whether said wirings are defective based on a detection on the current which is detected by said current detection means.

13. A wiring inspection apparatus in accordance with claim 12, wherein said core is structured in such a manner that said leg portions and said link portion generally form a U-shape in a side cross sectional view.

14. A method of inspecting wirings of a board, which inspects first and second wirings, each of which has a first end, in a condition that the first ends of said first and second wirings are electrically connected to each other, comprising the steps of:

a magnetic field applying step of applying a magnetic field to said first and second wirings on the first ends side of said first and second wirings while changing the magnetic flux with time;

a current detecting step of detecting a current which flows between said first and second wirings as the magnetic flux changes; and a defect judging step of judging whether said first and second wirings are defective or not based on a detection result.

15. A method of inspecting first and second wirings of a board which is structured as a work in which a plurality of work pieces are formed continuous and integrated with each other in a plane, each of said first and second wirings having a first end, the first ends of said first and second wirings of each said work piece being electrically connected to each other, said method comprising the steps of:

a first step of preparing a core which is entirely formed by a soft magnetic material and includes a first leg portion with a first end surface, a second leg portion with a second end surface and a link portion which links said leg portions to each other;

a second step of positioning the first and second end surfaces of said core on one side of said board such that the first and second end surfaces of said core are faced respectively with the first ends of said first and second wirings of different ones among said work pieces;

a third step of disposing a magnetic path generation plate made of a soft magnetic material parallel to said board on the other side of said board;

a fourth step of supplying a signal to a coil which is wound around said link portion to thereby apply a magnetic field simultaneously to said work pieces which are faced with the first and second end surfaces of said core while changing the magnetic flux with time;

a fifth step of detecting a current which flows, in accordance with a change in the magnetic flux, between said first and second wirings of said work pieces which are faced with the first and second end surfaces of said core; and a sixth step of judging, with respect to each one of said work pieces which are faced with the first and second end surfaces of said core, whether said first and second wirings are defective or not based on the current which is detected by said current detection means.

16. A wiring inspection method in accordance with claim 15, wherein said fifth step includes simultaneously detecting the currents which flow between said first and second wirings in the both of said work pieces which are faced with the first and second end surfaces of said core, and said sixth step includes simultaneously judging whether said first and second wirings are defective or not, simultaneously with respect to said work pieces which are faced with the first and second end surfaces of said core, based on detection results which are detected simultaneously at said fifth step.

17. A wiring inspection method in accordance with claim 15, wherein said fifth step includes sequentially detecting the currents, one at a time, which flow between said first and second wirings in said work pieces which are faced with the first and second end surfaces of said core, and said sixth step includes judging whether said first and second wirings of each one of said work pieces which is under current detection is defective or not every time the current is detected at said fifth step.

18. A wiring inspection method in accordance with claim 15, wherein upon completion of said sixth step of judging whether said wirings are defective or not in a pair of said work pieces, the first and second end surfaces of said core are faced against a different pair of said work pieces at said second step.

19. A wiring inspection apparatus for inspecting conductivity of a first and second wirings on a circuit board, each of the first and second wirings having a first and second ends, and the inspection being made with the first ends of the wirings being connected with each other, the apparatus comprising:

a current detector to be interposed between the second ends of the wirings to form a closed circuit with the wirings and detect the current running through the closed circuit;

a current inducing unit for inducing electric current in the closed circuit; and a conductivity detector for detecting the conductivity of the wiring in accordance with the output of the current detector.

20. A wiring inspection apparatus according to claim 19, wherein the current inducing unit includes an electromagnetic member for applying to the closed circuit, magnetic field of which magnetic flux change with time.

21. A wiring inspection apparatus according to claim 20, wherein the electromagnetic member includes a core made of soft magnetic material, a coil wound around the core and a current supply for supplying to the coil an electric current which changes with time.

22. A wiring inspection apparatus according to claim 21, wherein the core has a first leg portion with a first end surface, a second leg portion with a second end surface, and a link portion for interconnecting the first and second leg portions, the coil is wound around the link portion, and the first and second ends are to face the circuit board on the same side of the board.

23. A wiring inspection apparatus according to claim 22, further comprising a magnetic path providing plate made of a soft magnetic material and being to be disposed in parallel with the circuit board on the opposite side of the circuit board from the first and second ends of the core to guide the magnetic flux exerted from the first end of the core to the second end of the same.

24. A wiring inspection apparatus according to claim 23, wherein the circuit board to be inspected includes a plurality of work pieces planarly integrated with each other, each work piece including the first and second wirings, and the first and second ends of the core are to face the first and second wirings of different work pieces.

25. A wiring inspection apparatus according to claim 24, wherein the core has a U-shape in side view.

26. A method of inspecting wirings on a circuit board with a circuit board testing apparatus, the circuit board to be tested being structured as a work including a plurality of work pieces formed continuous and integrated with one another in a plane, each of the work pieces having a first and second wirings, each of the wirings having a first and second ends with the first ends of the wirings being connected with each other, the testing apparatus including a core having a first leg portion with a first end plane, a second leg portion with a second end plane, a link portion interconnecting the first and second leg portions, a coil wound around the link portion, and a current detector, the method, comprising the steps of:

positioning the core to face the first and second end planes to the first and second wirings of different work pieces on one side of the circuit board;

disposing a magnetic path forming plate on the other side of the circuit board than the side where the core is disposed;

connecting the current detector between the second ends of the wirings to form a closed circuit;

supplying to the coil electric current which changes with time, to cause time changing magnetic flux in the core, with the flux being supplied to the closed circuit to thereby induce electric current in the closed circuit; and measuring the induced current by the current detector to determine the conductivity of the wirings.

27. A wiring inspection apparatus for inspecting wirings formed on a board, each wiring having first and second ends, with the first ends being formed on the same plane of the board, the inspection being made with respect to selected first and second wirings with the first ends of wirings being connected with each other, the apparatus comprising:

a magnetic field applier including a core formed by a soft magnetic material and having a first leg portion with a first end surface, a second leg portion with a second end surface and a link portion which links said leg portions to each other, and a coil which is wound around said core, said first and second end surfaces being on the same side of the board where the first ends of the wirings are formed such that at least one of the first and second end surfaces opposes the first ends of the wirings;

an electric current supplier for supplying time-changing electric current to said coil such that the magnetic flux caused by the magnetic field appliers changes with time;

a magnetic path plate formed by a soft magnetic material and disposed on the opposite side of the board from the first and-second end surfaces of the magnetic field applier to guide the magnetic flux exerted from the first end surface and passing through the board, to the second end surface through said magnetic path plate;

a current detector connected between the second ends of the first and second wirings for detecting a current induced in the first and second wirings by the magnetic flux changing with time; and a defect judger for judging the defect of the first and second wirings based on the current detected by the current detector.

28. An apparatus for inspecting wirings of a board which is structured as a work in which a plurality of work pieces are formed continuous and integrated with each other in a plane, said apparatus adapted to inspect first and second wirings, each of which has a first end, in a condition that the first ends of said first and second wirings of each said work piece are electrically connected to each other, comprising:

(a) magnetic field applying means which comprises:

(a-1) a core formed entirely of a soft magnetic material and includes a first leg portion with a first end surface, a second leg portion with a second end surface and a link portion which links said leg portions to each other, said core being located on one side to said work, the first and second end surfaces of said core being faced respectively with the first ends of said wirings of different ones among said work pieces;

(a-2) a coil which is wound around said link portion; and (a-3) electric current supplying means for supplying time-changing electric current to said coil such that the magnetic flux caused by the magnetic field appliers changes with time;

(a-4) a magnetic path generation plate formed by a soft magnetic material and disposed parallel to said work on the other side of said work so that the magnetic flux which exists at one of said end surfaces of said core is guided to the other one of said end surfaces of said core and a magnetic circuit is consequently formed, said magnetic field applying means applying a magnetic field simultaneously to said work pieces which are faced with the first and second end surfaces of said core;

(b) magnetic field controlling means for supplying a signal to said magnetic field applying means so that the magnetic flux of the magnetic field changes with time;

(c) current detection means for detecting a current which flows, in accordance with a change in the magnetic flux, between said wirings of said work pieces which are faced with the first and second surfaces of said core; and (d) defect judging means for judging, with respect to each of the said work pieces which are faced with said first and second end surfaces of said core, whether said wirings are defective based on a detection on the current which is detected by said current detection means.

29. A wiring inspection apparatus for inspecting conductivity of a first and second wirings on a circuit board, each of the first and second wiring having a first and second ends, and the inspection being made with the first ends of the wirings being electrically connected to each other, comprising:

a current detector interposed between the second ends of the wirings to form a closed circuit and detects a current running through the closed circuit;

a current inducing unit for inducing electric current in the closed circuit wherein, said unit includes an electromagnetic member for applying to closed circuit a time-varying magnetic flux, said electromagnetic member including a core made of a soft magnetic material, a coil wound around the core and a current supply for supplying a time-varying electric current to the coil wherein said core has a first leg portion with a first end surface, a second leg portion with a second end surface, and a link portion for interconnecting the first and second leg portions, the coil is wound around the link portion, and the first and second ends are to face the circuit board on the same side of the board;

a conductivity detector for detecting the conductivity of the wiring in accordance with the output of the current detector; and a magnetic path providing plate made of a soft magnetic material and disposed in parallel with the circuit board on the opposite side of the circuit board from the first and second ends of the core to guide the magnetic flux exerted from the first end of the core to the second end of the same.

30. A wiring inspection apparatus for inspecting the conductivity of first and second wiring patterns on a circuit board, each of the first and second wiring patterns having first and second ends and the inspections being made with the first ends of the wiring patterns being connected with each other by a removable common wiring, the wiring inspection apparatus comprising:

a current detector unit to be interposed between the second ends of the wiring patterns including a pair of probes for electrically contacting the second ends of the first and second wiring patterns to form a closed circuit with the wiring patterns, the current detector unit detects current running through the closed circuit and provides an output signal;

an electromagnetic member for applying, on one side of the closed circuit, a magnetic field which changes over a predetermined time period to induce an electric current in the closed circuit;

a magnetic field guide member positioned on the other side of the closed circuit from the electromagnetic member for guiding the magnetic field applied to the closed circuit and limiting the range of the magnetic field; and a controller unit for receiving the output signal and providing an indication of the conductivity of the first and second wiring patterns.

* * * * *